US009099655B2

(12) United States Patent
Pan et al.

(10) Patent No.: US 9,099,655 B2
(45) Date of Patent: *Aug. 4, 2015

(54) COMPOSITION COMPRISING AT LEAST ONE EMITTER COMPOUND AND AT LEAST ONE POLYMER HAVING CONJUGATION-INTERRUPTING UNITS

(75) Inventors: Junyou Pan, Frankfurt am Main (DE); Rémi Manouk Anémian, Seoul (KR); Niels Schulte, Kelkheim (DE); Aurélie Ludemann, Frankfurt am Main (DE); Thomas Eberle, Landau (DE); Susanne Heun, Bad Soden (DE)

(73) Assignee: Merck Patent GmbH (DE)

( * ) Notice: Subject to any disclaimer, the term of this patent is extended or adjusted under 35 U.S.C. 154(b) by 416 days.

This patent is subject to a terminal disclaimer.

(21) Appl. No.: 13/266,783

(22) PCT Filed: May 4, 2010

(86) PCT No.: PCT/EP2010/002694
§ 371 (c)(1),
(2), (4) Date: Oct. 28, 2011

(87) PCT Pub. No.: WO2010/136111
PCT Pub. Date: Dec. 2, 2010

(65) Prior Publication Data
US 2012/0056170 A1 Mar. 8, 2012

(30) Foreign Application Priority Data
May 29, 2009 (DE) .......................... 10 2009 023 154

(51) Int. Cl.
| | | |
|---|---|---|
| H01L 51/54 | (2006.01) |
| C09K 11/06 | (2006.01) |
| C08G 73/06 | (2006.01) |
| C08G 2/18 | (2006.01) |
| H01L 51/00 | (2006.01) |
| C08G 61/02 | (2006.01) |
| H01L 51/50 | (2006.01) |

(52) U.S. Cl.
CPC .............. *H01L 51/004* (2013.01); *C08G 61/02* (2013.01); *H01L 51/0042* (2013.01); *H01L 51/0043* (2013.01); *C08G 2261/19* (2013.01); *C08G 2261/314* (2013.01); *C08G 2261/3142* (2013.01); *C09K 11/06* (2013.01); *C09K 2211/1416* (2013.01); *H01L 51/0085* (2013.01); *H01L 51/5016* (2013.01); *Y02E 10/549* (2013.01)

(58) Field of Classification Search
None
See application file for complete search history.

(56) References Cited

U.S. PATENT DOCUMENTS

| | | | | |
|---|---|---|---|---|
| 6,268,072 B1 * | 7/2001 | Zheng et al. | ................... | 428/690 |
| 2004/0131881 A1 * | 7/2004 | Zheng et al. | ................... | 428/690 |
| 2004/0258953 A1 | 12/2004 | Kido et al. | | |
| 2005/0129980 A1 | 6/2005 | Suzuki et al. | | |
| 2008/0138625 A1 | 6/2008 | Ye et al. | | |
| 2008/0176104 A1 | 7/2008 | Towns et al. | | |
| 2009/0226759 A1 | 9/2009 | Heun et al. | | |
| 2009/0230848 A1 | 9/2009 | Inoue et al. | | |
| 2010/0060151 A1 | 3/2010 | Igarashi et al. | | |

FOREIGN PATENT DOCUMENTS

| | | | | |
|---|---|---|---|---|
| EP | 1424350 | | 6/2004 | |
| EP | 1424350 A1 | | 6/2004 | |
| JP | 2000104057 A | * | 4/2000 | ............ C09K 11/06 |
| JP | 2003342325 A | | 12/2003 | |
| JP | 2004500468 A | | 1/2004 | |
| JP | 2004217837 A | | 8/2004 | |
| JP | 2005149766 A | | 6/2005 | |
| JP | 2009076834 A | | 4/2009 | |
| WO | WO-01/66618 A1 | | 9/2001 | |
| WO | WO-02/04543 A1 | | 1/2002 | |
| WO | WO-2005013386 A2 | | 2/2005 | |
| WO | WO-2006/061181 A1 | | 6/2006 | |
| WO | WO-2007/029410 | | 3/2007 | |
| WO | WO 2008011953 A1 | * | 1/2008 | ............ C08L 65/00 |
| WO | WO-2008/066196 A1 | | 6/2008 | |
| WO | WO-2009/026235 A2 | | 2/2009 | |
| WO | WO 2009038413 A2 | * | 3/2009 | ............ C08G 61/12 |

OTHER PUBLICATIONS

Machine translation of JP2000-104057. Date of publication: Apr. 11, 2000.*
Kreyenschmidt, M., et al., "Thermally Stable Blue-Light-Emitting Copolymers of Poly(alkylfluorene)," Macromolecules, 1998, vol. 31, pp. 1099-1103.
Romero, D.B., et al., "The role of carbazole in organic light-emitting devices," Synthetic Metals, 1996, vol. 80, pp. 271-277.
Wong, W., et al., "Harvesting of Organic Triplet Emissions in Metal Diynes and Polyynes of Group 10-12 Transition Elements Containing the Conjugation-Interrupting Diphenylfluorene Unit," Macromolecules, 2004, vol. 37, pp. 4496-4504.
International Search Report dated Aug. 18, 2010 of PCT application PCT/EP2010/002694.
Japanese Office Action for Patent Application No. 2012-512227, dated Oct. 1, 2013.

* cited by examiner

*Primary Examiner* — Andrew K Bohaty
(74) *Attorney, Agent, or Firm* — Drinker Biddle & Reath LLP

(57) ABSTRACT

The present invention relates to a composition, containing at least one emitter compound and at least one polymer with conjugation-interrupting units, to the use of said composition in an optoelectronic apparatus and to an optoelectronic apparatus which contains said inventive composition.

26 Claims, 2 Drawing Sheets

Figure 1:
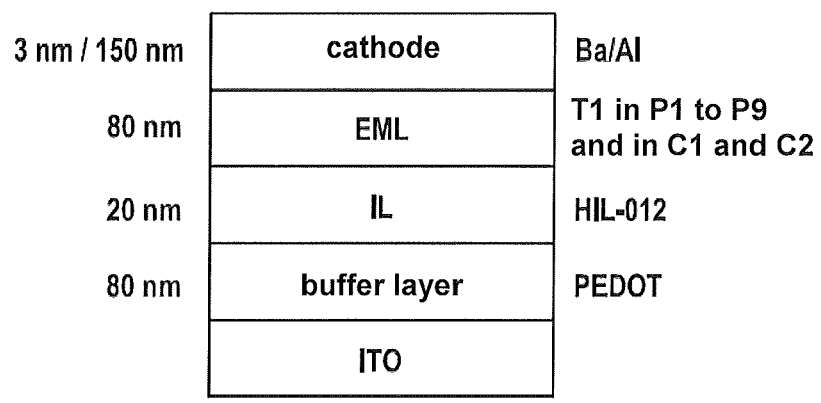

COMPOSITION COMPRISING AT LEAST ONE EMITTER COMPOUND AND AT LEAST ONE POLYMER HAVING CONJUGATION-INTERRUPTING UNITS

CROSS-REFERENCE TO RELATED APPLICATIONS

This application is a national stage application (under 35 U.S.C. §371) of PCT/EP2010/002694, filed May 4, 2010, which claims benefit of German application 10 2009 023 154.4, filed May 29, 2009.

BACKGROUND OF THE INVENTION

The present invention relates to a composition comprising at least one emitter compound and at least one polymer having conjugation-interrupting units, to the use of this composition in an opto-electronic device, and to an opto-electronic device which comprises this composition according to the invention.

Both singlet and triplet emitters are known as possible emitter compounds from the prior art. In recent years, organometallic complexes which exhibit phosphorescence instead of fluorescence are increasingly being employed as emitting materials in opto-electronic devices (M. A. Baldo et al., *Appl. Phys. Lett.* 1999, 75, 4-6). Triplet emitters which are known from the prior art are usually metal complexes, since, in particular, heavy metals favour triplet transition. In general, however, there are still considerable problems in the case of OLEDs which exhibit triplet emission. Thus, the physical properties of phosphorescent emitters are still inadequate for use in high-quality and long-lived electroluminescent devices with respect to the stability of metal complexes, efficiency, operating voltage and lifetime. Further improvements are therefore necessary here. Further improvements are also still necessary in the case of other compounds used in organic electroluminescent devices, such as, for example, matrix materials and charge-transport materials. In particular, the matrix materials must be matched to the emitter compounds used, since otherwise undesired quenching effects may arise.

Conjugated polymers have already been investigated intensively for some time as highly promising materials in OLEDs. Their simple preparation promises inexpensive production of corresponding electroluminescent devices. However, conjugated polymers used and known to date have the disadvantage that the achievable efficiency has a certain upper limit. This is, in particular, at the HOMO-LUMO separations and at the singlet and triplet energy levels of the polymer and the emitter compound. For example, if the triplet level of the polymer is lower than that of the emitter, the triplet energy of the emitter can be transferred to the polymer by an energy-transfer mechanism. The phosphorescence is thus quenched.

The best-known polymer triplet matrix is PVK (polyvinylcarbazole) (Yang, X.; Neher, D.; Hertel, D.; Daeubler, T. K.; Highly efficient single-layer polymer electrophosphorescent devices; Adv. Mater. (Weinheim, Ger.) 16[2], 161-166. 2004). This is a non-conjugated polymer.

U.S. Pat. No. 7,250,226 B2 discloses a triplet emitter polymer which has hole-transport, electron-transport and emitter units in the side chain of the polymer.

Wai-Yeung Wong et al., Macromolecules 2004, 37, 4496-4504, propose employing polymers having fluorene units as conjugation interrupters, where the triplet emitter unit is incorporated into the polymer chain.

JP 2001/257076 discloses an OLED comprising a non-conjugated polymer as host and a metal complex with group VIII metals as dopant. Polyvinylcarbazole is disclosed as non-conjugated polymer matrix.

None of these systems exhibits optimum electro-optical properties (for example adequate efficiency) and all have deficits with respect to their stability. In particular, the polymers which have functional units in the main or side chain of the polymer are, in addition, difficult to prepare.

BRIEF SUMMARY OF THE INVENTION

The object of the present invention therefore consisted in the provision of a system which has high stability and efficiency, in particular in the case of blue-, green- and red-emitting compounds, and is simple to prepare.

Surprisingly, it has been found that polymeric matrix materials which have conjugation-interrupting units have increased efficiency and lifetime in combination with emitter compounds which are not bonded to the polymer. A system of this type is, in addition, simple to prepare and can be processed by coating from solution. These matrix materials can be employed both for singlet emitters and also triplet emitters.

The present invention thus relates to a composition comprising at least one emitter compound and at least one polymer, which is characterised in that the polymer comprises at least one structural unit of the general formula I,

formula I where the following applies to the symbols and indices used:

A is on each occurrence, independently of one another, a conjugation-interrupting unit, FG is on each occurrence, independently of one another, an opto-electronic functional group, and n is greater than 1, preferably ≥10, and is particularly preferably in the range from 10 to 10,000.

A DETAILED DESCRIPTION OF THE INVENTION

The present invention furthermore relates to a polymer which is characterised in that it comprises at least one structural unit of the general formula I,

formula I where the following applies to the symbols and indices used:

A is on each occurrence, independently of one another, a conjugation-interrupting unit, FG is on each occurrence, independently of one another, an opto-electronic functional group, and n is greater than 1, preferably ≥10, and is particularly preferably in the range from 10 to 10,000.

In a preferred embodiment of the present invention, the polymer comprises at least one further structural unit of the formula Ia

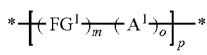

formula Ia where the following applies to the symbols and indices used:
A¹ is on each occurrence, independently of one another, a conjugation-interrupting unit,
FG¹ is on each occurrence, independently of one another, an opto-electronic functional group,
m, o are each, independently of one another, 0, 1 or 2, where the sum (m+) is greater than or equal to 1,
p is greater than or equal to 1.
The following possible combinations arise for m and o:

| m | o |
|---|---|
| 0 | 1 |
| 0 | 2 |
| 1 | 0 |
| 2 | 0 |
| 1 | 1 |
| 1 | 2 |
| 2 | 1 |
| 2 | 2 |

In one embodiment, it is preferred if m=2 and at least one FG¹=FG.

In the present invention, the term "polymer" is taken to mean both polymeric compounds, oligomeric compounds and dendrimers. The polymeric compounds according to the invention preferably have 10 to 10,000, particularly preferably 20 to 5000 and in particular 50 to 2000 recurring units (structural units). The oligomeric compounds according to the invention preferably have 2 to 9 recurring units. The branching factor of the polymers here is between 0 (linear polymer, no branching points) and 1 (fully branched dendrimer). "Dendrimer" here is generally intended to be taken to mean as described, for example, by M. Fischer and F. Vögtle (*Angew. Chem., Int. Ed.* 1999, 38, 885).

The number-average molecular weight $M_n$ of the polymer is preferably in the range from 100,000 to 2,500,000 g/mol, particularly preferably in the range from 200,000 to 2,000,000 g/mol and in particular in the range from 250,000 to 1,500,000 g/mol. $M_n$ is determined by gel permeation chromatography with polystyrene as internal standard.

In general, FG and FG¹ are each, independently of one another, preferably a substituted or unsubstituted, aromatic or heteroaromatic ring system or an aromatic or heteroaromatic group if this ring system or the aromatic or heteroaromatic group has opto-electronic functional properties.

An aromatic group (aryl group) in the sense of the present invention contains 5 to 60 C atoms; a heteroaromatic group (heteroaryl group) in the sense of the present invention contains 2 to 60 C atoms and at least one heteroatom, with the proviso that the sum of C atoms and heteroatoms is at least 5. The heteroatoms are preferably selected from Si, N, P, O, Se and/or S, particularly preferably selected from N, O and/or S. An aryl group or heteroaryl group here is taken to mean either a simple aromatic ring, i.e. benzene, or a simple heteroaromatic ring, for example pyridine, pyrimidine, thiophene, etc., or a condensed aryl or heteroaryl group, for example naphthalene, anthracene, phenanthrene, quinoline, isoquinoline, benzothiophene, benzofuran and indole, etc. Of these, naphthalene and quinoline are particularly preferred.

If the emitter compound in the composition according to the invention is a triplet emitter or a metal complex, the functional group FG and/or FG¹ in the formula I or Ia is particularly preferably selected from a monocyclic or bicyclic condensed aromatic or heteroaromatic group, and m in formula Ia is preferably 0 or 1.

An aromatic ring system in the sense of the present invention (irrespective of whether it occurs as FG or FG¹ or generally as a substituent) contains 5 to 60 C atoms in the ring system. The heteroaromatic ring system in the sense of the present invention contains 2 to 60 C atoms and at least one heteroatom in the ring system, with the proviso that the sum of C atoms and heteroatoms is at least 5. The heteroatoms are preferably selected from Si, N, P, O, Se and/or S, particularly preferably selected from N, O and/or S.

An aromatic or heteroaromatic ring system in the sense of the present invention is, in addition, intended to be taken to mean a system which does not necessarily contain only aryl or heteroaryl groups, but instead in which, in addition, a plurality of aryl or heteroaryl groups may be interrupted by a non-aromatic unit (preferably less than 10% of the atoms other than H), such as, for example, a C ($sp^3$-hybridised), N or O atom. Thus, for example, systems such as 9,9'-spirobifluorene, 9,9-diarylfluorene, triarylamine, diaryl ether, stilbene, etc., are also intended to be taken to be aromatic ring systems in the sense of the present invention, as are systems in which two or more aryl groups are interrupted, for example, by a linear or cyclic alkyl group or by a silyl group.

An aromatic or heteroaromatic ring system having 5 to 60 aromatic ring atoms, which may in each case also be substituted by any desired radicals R, where R is selected from the group consisting of H, a $C_{1-40}$-alkyl group, a $C_{2-40}$-alkenyl group, a $C_{2-40}$-alkynyl group, an optionally substituted $C_{6-40}$-aryl group and an optionally substituted 5- to 25-membered heteroaryl group, and which may be linked to the aromatic or heteroaromatic ring system via any desired positions, is taken to mean, in particular, groups derived from benzene, naphthalene, anthracene, ketone, diaryl ketone, amine, triarylamine, phenanthrene, pyrene, chrysene, perylene, fluoranthene, naphthacene, pentacene, benzopyrene, biphenyl, biphenylene, terphenyl, terphenylene, fluorene, spirobifluorene, dihydrophenanthrene, dihydropyrene, tetrahydropyrene, cis- or trans-indenofluorene, truxene, isotruxene, spirotruxene, spiroisotruxene, furan, benzofuran, isobenzofuran, dibenzofuran, thiophene, benzothiophene, isobenzothiophene, dibenzothiophene, pyrrole, indole, isoindole, carbazole, pyridine, quinoline, isoquinoline, acridine, phenanthridine, benzo-5,6-quinoline, benzo-6,7-quinoline, benzo-7,8-quinoline, phenothiazine, phenoxazine, pyrazole, indazole, imidazole, benzimidazole, naphthimidazole, phenanthrimidazole, pyridimidazole, pyrazinimidazole, quinoxalin-imidazole, oxazole, benzoxazole, naphthoxazole, anthroxazole, phenanthroxazole, isoxazole, 1,2-thiazole, 1,3-thiazole, benzothiazole, pyridazine, benzopyridazine, pyrimidine, benzopyrimidine, quinoxaline, 1,5-diazaanthracene, 2,7-diazapyrene, 2,3-diazapyrene, 1,6-diazapyrene, 1,8-diazapyrene, 4,5-diazapyrene, 4,5,9,10-tetraazaperylene, pyrazine, phenazine, phenoxazine, phenothiazine, fluorubin, naphthyridine, azacarbazole, benzocarboline, phenanthroline, 1,2,3-triazole, 1,2,4-triazole, benzotriazole, 1,2,3-oxadiazole, 1,2,4-oxadiazole, 1,2,5-oxadiazole, 1,3,4-oxadiazole, 1,2,3-thiadiazole, 1,2,4-thiadiazole, 1,2,5-thiadiazole, 1,3,4-thiadiazole, 1,3,5-triazine, 1,2,4-triazine, 1,2,3-triazine, tetrazole, 1,2,4,5-tetrazine, 1,2,3,4-tetrazine, 1,2,3,5-tetrazine, purine, pteridine, indolizine and benzothiadiazole.

FG and FG¹ are particularly preferably each selected, independently of one another, from phenyl, naphthyl, pyridine, anthracene, binaphthylanthracene, phenanthrene, dihydrophenanthrene, indenofluorene, fluorene, spirobifluorene, pyrene, phosphine, phosphine oxide, furan, imidazole, thiophene, triazine, pyrazine, ketone, amine, carbazole and combinations thereof and derivatives and heteroatom variants thereof. A combination here is intended to be taken to mean a compound which is composed of two or more of the said basic structures. For example, a carbazole can be covalently bonded to a fluorene unit.

The above-mentioned groups can exert various functions within an opto-electronic device. It is therefore sensible to divide the functional groups FG and $FG^1$ up with respect to their preferred functional properties.

The opto-electronic functional group FG or $FG^1$ is in each case, independently of one another, preferably a hole-injection group, a hole-transport group, a hole-blocking group, an electron-injection group, an electron-transport group, an electron-blocking group, a photon-absorption group, an exciton-generating group, a singlet exciton sensitiser, an emitter group or a backbone group. It is likewise possible for two or more functional groups to be present in the polymer alongside one another or for a functional group to have two or more functions, for example a hole-transport function and an electron-transport function.

A hole-injection group and/or hole-transport group in the sense of the present invention is a group having an energetically high HOMO ("highest occupied molecular orbital"), preferably >−5.8 eV, particularly preferably >−5.5 eV (against vacuum level). This supports hole injection. The influence on hole transport depends on the concentration of the group within the polymer. At concentrations of <4 mol %, based on the polymer, an inadequate concentration for effective hole transport is usually present. The group then has the function of a hole trap. The concentration of the hole-injection and/or hole-transport group should thus preferably be >4 mol %, particularly preferably >6 mol %, based on the polymer. For effective hole transport, the concentration in the polymer should preferably be >10 mol %, particularly preferably >15 mol %. In the case of a simultaneously low-lying LUMO, a group of this type can have an electron-blocking function.

The hole-injection and/or hole-transport group is preferably a triarylamine, benzidine, tetraaryl-para-phenylenediamine, triarylphosphine, phenothiazine, phenoxazine, dihydrophenazine, thianthrene, dibenzo-para-dioxin, phenoxathiyne, carbazole, azulene, thiophene, pyrrole or furan derivative and in addition an O-, S-, Se- or N-containing heterocycle having a high-lying HOMO (HOMO=highest occupied molecular orbital). These arylamines and heterocycles preferably result in an HOMO in the polymer of greater than −5.8 eV (against vacuum level), particularly preferably greater than −5.5 eV.

An electron-injection and/or electron-transport group in the sense of the present invention is a group having a low-lying LUMO ("lowest unoccupied molecular orbital"), preferably <−1.9 eV, particularly preferably <−2.5 eV (against vacuum level). This supports electron injection. The influence on electron transport depends on the concentration of the group within the polymer. At concentrations of <4 mol %, based on the polymer, an inadequate concentration for effective electron transport is present. The group then has the function of an electron trap. The concentration of the electron-injection and/or electron-transport group should thus preferably be >4 mol %, particularly preferably >6 mol %, based on the polymer. For effective electron transport, the concentration in the polymer should preferably be >10 mol %, particularly preferably >15 mol %. In the case of a low-lying HOMO, a group of this type can have a hole-blocking function.

The electron-injection and/or electron-transport group is preferably a pyridine, pyrimidine, pyridazine, pyrazine, oxadiazole, quinoline, quinoxaline, anthracene, benzanthracene, pyrene, perylene, benzimidazole, triazine, ketone, phosphine oxide or phenazine derivative, but it is also possible to use triarylboranes and further O-, S- or N-containing heterocycles having a low-lying LUMO (LUMO=lowest unoccupied molecular orbital). These units preferably result in an LUMO in the polymer of less than −1.9 eV (against vacuum level), particularly preferably less than −2.5 eV.

A combination of hole-injection group and/or hole-transport group and electron-injection group and/or electron-transport group is possible for the purposes of this invention, where these simultaneously have a high HOMO and a low LUMO.

A photon-absorption group in the sense of the present invention is preferably a group which is capable of absorbing a photon of any desired energy or any desired wavelength, preferably in the spectral region of visible light. In general, these are dyes. Suitable dyes are, for example, those which are usually also used in organic photovoltaic cells, in dye-sensitised solar cells, in charge-generation layers or in xerographic devices. Preferred dyes are, for example, perylenes and derivatives thereof (Angew. Chem. Int. Ed. 2006, 45, 3364-3368), ruthenium dyes and derivatives thereof (Nature, 1991, 353, p. 737 and Angew. Chemie. Int. Ed. 2005, 44, 5740-5744), phthalocyanines, azo dyes, rylenes, perylene diimides, perylene bisdicarboximides, terrylenes, quaterrylenes, phosphyrines, squarines and derivatives thereof.

An exciton-generating group in the sense of the present invention is preferably taken to mean a group which is capable of generating an exciton by recombination of a hole and an electron.

An emitter group is a group which is capable of emitting light, for example a fluorescent or phosphorescent dye. Fluorescent dyes are predominantly singlet emitters. A triplet emitter group in the sense of the present invention is preferably a group which is able to emit light from the triplet state with high efficiency, even at room temperature, i.e. exhibits electrophosphorescence instead of electrofluorescence, which frequently causes an increase in the energy efficiency. Suitable for this purpose are firstly compounds which contain heavy atoms having an atomic number of greater than 36. Preference is given to compounds which contain d- or f-transition metals which satisfy the above-mentioned condition. Particular preference is given here to corresponding structural units which contain elements from groups 8 to 10 (Ru, Os, Rh, Ir, Pd, Pt). Suitable structural units for the polymers according to the invention here are, for example, various complexes, as described, for example, in WO 02/068435 A1, WO 02/081488 A1, EP 1239526 A2 and WO 2004/026886 A2. Corresponding monomers are described in WO 02/068435 A1 and in WO 2005/042548 A1.

In addition, the polymer according to the invention may contain functional groups FG or $FG^1$ which improve transfer from the singlet state to the triplet state and which, employed in support of the emitter groups, improve the phosphorescence properties of these structural elements. Suitable for this purpose are, in particular, carbazole and bridged carbazole dimer units, as described, for example, in WO 2004/070772 A2 and WO 2004/113468 A1. Also suitable for this purpose are ketones, phosphine oxides, sulfoxides, sulfones, silane derivatives and similar compounds, as described, for example, in WO 2005/040302 A1.

Suitable further emitter groups in the sense of the present invention are aromatic structures having 6 to 40 C atoms and also tolan, stilbene or bisstyrylarylene derivatives, each of which may be substituted by one or more radicals R, where R is selected from the group consisting of H, a $C_{1-40}$-alkyl group, a $C_{2-40}$-alkenyl group, a $C_{2-40}$-alkynyl group, an optionally substituted $C_{6-40}$-aryl group and an optionally substituted 5- to 25-membered heteroaryl group. Particular preference is given here to the incorporation of 1,4-phenylene, 1,4-naphthylene, 1,4- or 9,10-anthrylene, 1,6-, 2,7- or 4,9-pyrenylene, 3,9- or 3,10-perylenylene, 4,4'-biphenylylene, 4,4''-terphenylylene, 4,4'-bis-1,1'-naphthylylene, 4,4'-tolanylene, 4,4'-stilbenylene, 4,4''-bisstyrylarylene, benzothiadiazole and corresponding oxygen derivatives, quinoxaline, phenothiazine, phenoxazine, dihydrophenazine, bis(thiophenyl)arylene, oligo(thiophenylene), phenazine, rubrene, pentacene or perylene derivatives, which are preferably substituted, or preferably conjugated push-pull systems (systems which are substituted by donor and acceptor substituents) or systems such as squarines or quinacridones, which are preferably substituted.

Functional groups FG and $FG^1$ in the sense of the present invention which can be employed as backbone group are preferably aromatic structures having 6 to 40 C atoms. These are, for example, 4,5-dihydropyrene derivatives, 4,5,9,10-tetrahydropyrene derivatives, fluorene derivatives, 9,9'-spirobifluorene derivatives, phenanthrene derivatives, 9,10-dihydrophenanthrene derivatives, 5,7-dihydrodibenzoxepine derivatives and cis- and trans-indenofluorene derivatives.

In the structural units of the general formulae I and Ia, A and $A^1$ are each, independently of one another, a so-called conjugation-interrupting unit. This is taken to mean a unit which disturbs or preferably interrupts the conjugation, for example a unit in which the conjugation is disturbed by at least one $sp^3$-hybridised atom, preferably carbon. The conjugation can likewise be disturbed by a non-$sp^3$-hybridised atom, for example by N, P or Si.

A and $A^1$ are preferably each selected, independently of one another, from the group consisting of linear or branched alkylene, cycloalkylene, alkylsilylene, silylene, arylsilylene, alkylalkoxyalkylene, arylalkoxyalkylene, alkylthioalkylene, sulfone, alkylenesulfone, sulfone oxide, alkylenesulfone oxide, where the alkylene group in each case has, independently of one another, 1 to 12 C atoms and where one or more H atoms may be replaced by F, Cl, Br, I, alkyl, heteroalkyl, cycloalkyl, aryl or heteroaryl.

A and $A^1$ particularly preferably denote a linear or branched alkylene or alkoxyalkylene having 1 to 12 C atoms, where one or more H atoms may be replaced by F.

A or $A^1$ further preferably conforms to the general formulae A-Ia, A-Ib, A-Ic, A-Id, A-Ie, A-If, A-Ig, A-Ih, A-Ii, A-Ij, A-Ik, A-Im, A-In, A-Io and A-Ip, A-Ia

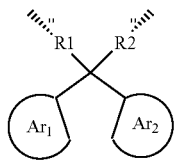

A-Ib

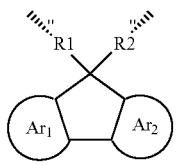

A-Ic

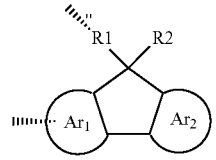

A-Id

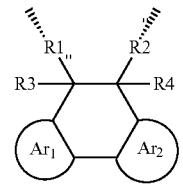

A-Ie

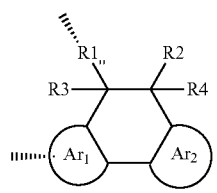

A-If

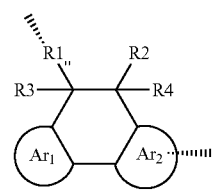

A-Ig

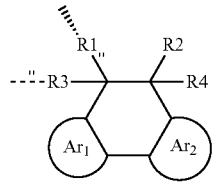

A-Ih

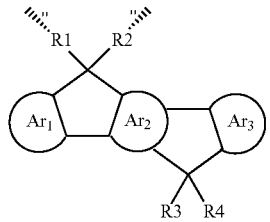

A-Ii

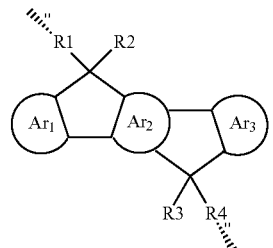

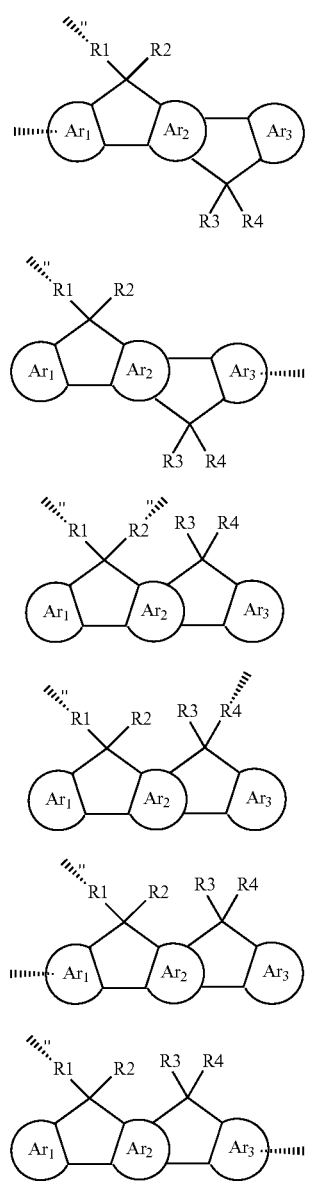

A-Ij

A-Ik

A-Im

A-In

A-Io

A-Ip where Ar₁, Ar₂ and Ar₃ each, independently of one another, denote an aromatic or heteroaromatic group having 5 to 60 ring atoms, two of the radicals R1 to R4 or one of the radicals R1 to R4 and one of the groups Ar₁, Ar₂ and Ar₃ form a bond to FG in the general formula I or FG$^1$ in the general formula Ia and a further structural unit, which may be identical to or different from the structural unit of the formula I, and/or R1, R2, R3 and R4 each, independently of one another, denote alkylene, cycloalkylene, alkylsilylene, silylene, arylsilylene, alkylalkoxyalkylene, arylalkoxyalkylene, alkylthioalkylene, phosphine, phosphine oxide, sulfone, alkylenesulfone, sulfone oxide, alkylenesulfone oxide, where the alkylene group in each case has, independently of one another, 1 to 12 C atoms and where one or more H atoms may be replaced by F, Cl, Br, I, alkyl, heteroalkyl, cycloalkyl, an aryl or heteroaryl group.

The substituents R1 to R4 on the respective Ar₁, Ar₂ or Ar₃ may either be adjacent or one or more ring atoms may be in between. The atoms to which the substituents R1 to R4 are bonded are ring atoms of the aromatic or heteroaromatic group.

Particular preference is given to the following structures:

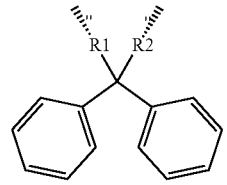

A-Ia-1

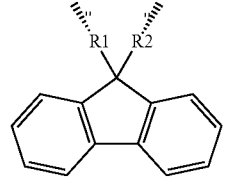

A-Ib-1

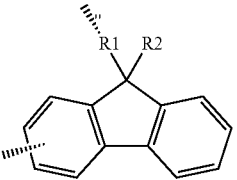

A-Ic-1

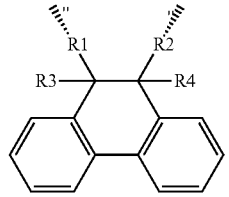

A-Id-1

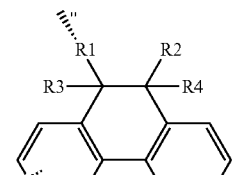

A-Ie-1

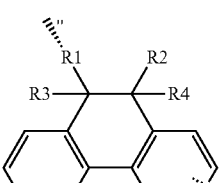

A-If-1

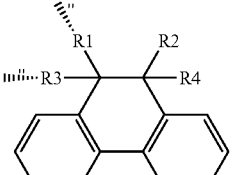

A-Ig-1

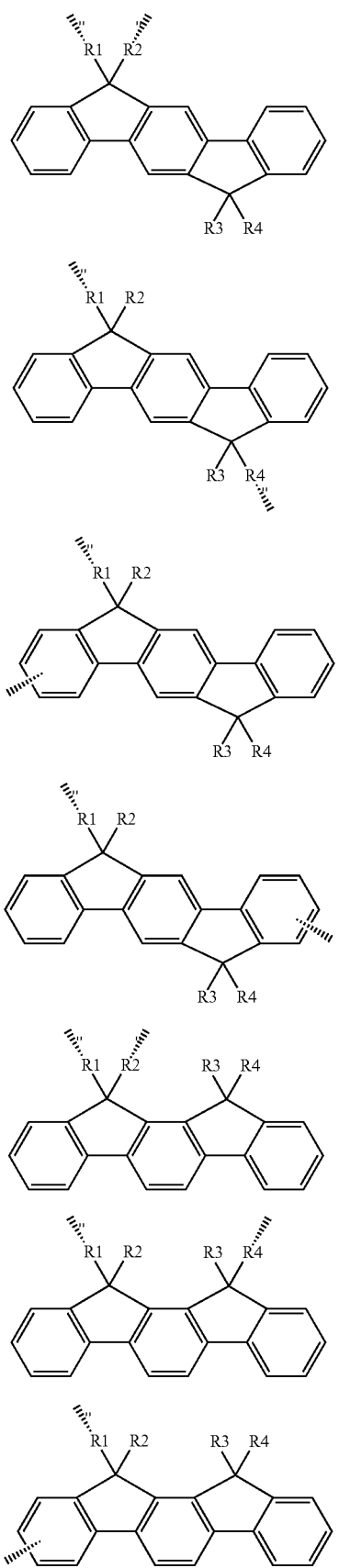
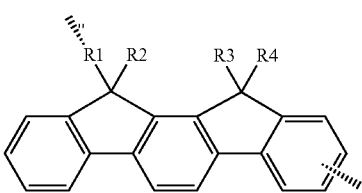

A-Ih-1
A-Ii-1
A-Ij-1
A-Ik-1
A-Im-1
A-In-1
A-Io-1
A-Ip-1 where the symbols and indices have the meanings indicated for structures A-Ia to A-Ip.

In a further embodiment of the present invention, it is preferred for the polymer to comprise further structural units which are different from the formulae I and/or Ia. These may be located either in the main chain (backbone) or in a side chain of the polymer. The further structural units can originate, for example, from the following classes:

Group 1: units which enhance the hole-injection and/or hole-transport properties of the polymers;
Group 2: units which enhance the electron-injection and/or electron-transport properties of the polymers;
Group 3: units which have combinations of individual units from group 1 and group 2;
Group 4: units which modify the emission characteristics to such an extent that electrophosphorescence can be obtained instead of electrofluorescence;
Group 5: units which improve transfer from the so-called singlet state to the triplet state;
Group 6: units which influence the emission colour of the resultant polymers;
Group 7: units which are typically used as backbone;
Group 8: units which influence the film-morphological and/or rheological properties of the resultant polymers.

Preferred polymers are those in which at least one structural unit has charge-transport properties, i.e. which comprise units from group 1 and/or 2.

Structural units from group 1 which have hole-injection and/or hole-transport properties are, for example, triarylamine, benzidine, tetraaryl-para-phenylenediamine, triarylphosphine, phenothiazine, phenoxazine, dihydrophenazine, thianthrene, dibenzo-para-dioxin, phenoxathiyne, carbazole, azulene, thiophene, pyrrole and furan derivatives and further O-, S-, Se- or N-containing heterocycles having a high-lying HOMO (HOMO=highest occupied molecular orbital). These arylamines and heterocycles preferably result in an HOMO in the polymer of greater than −5.8 eV (against vacuum level), particularly preferably greater than −5.5 eV.

Structural units from group 2 which have electron-injection and/or electron-transport properties are, for example, pyridine, pyrimidine, pyridazine, pyrazine, oxadiazole, quinoline, quinoxaline, anthracene, benzanthracene, pyrene, perylene, benzimidazole, triazine, ketone, phosphine oxide and phenazine derivatives, but also triarylboranes and further O-, S- or N-containing heterocycles having a low-lying LUMO (LUMO=lowest unoccupied molecular orbital). These units in the polymer preferably result in an LUMO of less than −1.9 eV (against vacuum level), particularly preferably less than −2.5 eV.

It may be preferred for the polymers to comprise units from group 3 in which structures which increase the hole mobility and structures which increase the electron mobility (i.e. units from groups 1 and 2) are bonded directly to one another or structures which increase both the hole mobility and the electron mobility. Some of these units can serve as emitters and shift the emission colour into the green, yellow or red. Their use is thus suitable, for example, for the generation of other emission colours from originally blue-emitting polymers.

Structural units from group 4 are those which are able to emit light from the triplet state with high efficiency, even at room temperature, i.e. exhibit electrophosphorescence instead of electrofluorescence, which frequently causes an increase in the energy efficiency. Suitable for this purpose are firstly compounds which contain heavy atoms having an atomic number of greater than 36. Preference is given to compounds which contain d- or f-transition metals which satisfy the above-mentioned condition. Particular preference is given here to corresponding structural units which contain elements from groups 8 to 10 (Ru, Os, Rh, Ir, Pd, Pt). Suitable structural units for the polymers according to the invention here are, for example, various complexes, as described, for example, in WO 02/068435 A1, WO 02/081488 A1, EP 1239526 A2 and WO 2004/026886 A2. Corresponding monomers are described in WO 02/068435 A1 and in WO 2005/042548 A1.

Structural units from group 5 are those which improve transfer from the singlet state to the triplet state and which, employed in support of the structural elements from group 4, improve the phosphorescence properties of these structural elements. Suitable for this purpose are, in particular, carbazole and bridged carbazole dimer units, as described, for example, in WO 2004/070772 A2 and WO 2004/113468 A1. Also suitable for this purpose are ketones, phosphine oxides, sulfoxides, sulfones, silane derivatives and similar compounds, as described, for example, in WO 2005/040302 A1.

Structural units from group 6, besides those mentioned above, are those which have at least one further aromatic structure or another conjugated structure which does not fall under the above-mentioned groups, i.e. which have only little influence on the charge-carrier mobilities, are not organometallic complexes or do not influence singlet-triplet transfer. Structural elements of this type can influence the emission colour of the resultant polymers. Depending on the unit, they can therefore also be employed as emitters. Preference is given here to aromatic structures having 6 to 40 C atoms and also tolan, stilbene or bisstyrylarylene derivatives, each of which may be substituted by one or more radicals R. Particular preference is given here to the incorporation of 1,4-phenylene, 1,4-naphthylene, 1,4- or 9,10-anthrylene, 1,6-, 2,7- or 4,9-pyrenylene, 3,9- or 3,10-perylenylene, 4,4'-biphenylylene, 4,4"-terphenylylene, 4,4'-bi-1,1'-naphthylylene, 4,4'-tolanylene, 4,4'-stilbenylene, 4,4"-bisstyrylarylene, benzothiadiazole and corresponding oxygen derivatives, quinoxaline, phenothiazine, phenoxazine, dihydrophenazine, bis(thiophenyl)arylene, oligo(thiophenylene), phenazine, rubrene, pentacene or perylene derivatives, which are preferably substituted, or preferably conjugated push-pull systems (systems which are substituted by donor and acceptor substituents) or systems such as squarines or quinacridones, which are preferably substituted.

Structural units from group 7 are units which contain aromatic structures having 6 to 40 C atoms, which are typically used as polymer backbone. These are, for example, 4,5-dihydropyrene derivatives, 4,5,9,10-tetrahydropyrene derivatives, fluorene derivatives, 9,9'-spirobifluorene derivatives, phenanthrene derivatives, 9,10-dihydrophenanthrene derivatives, 5,7-dihydrodibenzoxepine derivatives and cis- and trans-indenofluorene derivatives.

Structural units from group 8 are those which influence the film-morphological properties and/or rheological properties of the polymers, such as, for example, siloxanes, long alkyl chains or fluorinated groups, but also particularly rigid or flexible units, such as, for example, liquid crystal-forming units or crosslinkable groups.

Preference is given to polymers which, besides the structural units of the formula I, at the same time additionally comprise one or more units selected from groups 1 to 8 which are different from the structural units (recurring units) of the formula I according to the invention. It may likewise be preferred for more than one recurring unit from one group to be present at the same time.

Preference is given here to polymers which, besides at least one structural unit of the formula I, also comprise units from group 7, particularly preferably at least 50 mol % of these units, based on the total number of structural units in the polymer.

It is likewise preferred for the polymers to comprise units which improve charge transport and/or charge injection, i.e. units from group 1 and/or 2; a proportion of 0.5 to 30 mol % of these units is particularly preferred; a proportion of 1 to 10 mol % of these units is particularly preferred.

It is furthermore particularly preferred for the polymers to comprise structural units from group 7 and units from group 1 and/or 2, in particular at least 50 mol % of units from group 7 and 0.5 to 30 mol % of units from group 1 and/or 2.

All structural units mentioned in groups 1 to 8 can likewise be employed for the purposes of the present invention as functional groups FG or FG$^1$.

The polymers according to the invention are generally prepared by polymerisation of one or more types of monomer, of which at least one type of monomer results in structural units of the formula I in the polymer. Suitable polymerisation reactions are known to the person skilled in the art and are described in the literature. Particularly suitable and preferred polymerisation reactions which result in C—C or C—N links are the following:
(A) SUZUKI polymerisation;
(B) YAMAMOTO polymerisation;
(C) STILLE polymerisation;
(D) HECK polymerisation;
(E) NEGISHI polymerisation;
(F) SONOGASHIRA polymerisation;
(G) HIYAMA polymerisation; and
(H) HARTWIG-BUCHWALD polymerisation.

The way in which the polymerisation can be carried out by these methods and the way in which the polymers can then be separated off from the reaction medium and purified is known to the person skilled in the art and is described in detail in the literature, for example in WO 03/048225 A2, WO 2004/037887 A2 and WO 2004/037887 A2.

The methods for the C—C linking are preferably selected from the group comprising SUZUKI coupling, YAMAMOTO coupling and STILLE coupling, and the method for a C—N linking is preferably a HARTWIG-BUCHWALD coupling.

The present invention thus also relates to a process for the preparation of the polymers according to the invention, which is characterised in that they are prepared by SUZUKI polymerisation, YAMAMOTO polymerisation, STILLE polymerisation or HARTWIG-BUCHWALD polymerisation.

The dendrimers according to the invention can be prepared by processes known to the person skilled in the art or analogously thereto. Suitable processes are described in the literature, such as, for example, in Frechet, Jean M. J.; Hawker, Craig J., "Hyperbranched polyphenylene and hyperbranched polyesters: new soluble, three-dimensional, reactive polymers", Reactive & Functional Polymers (1995), 26(1-3), 127-36; Janssen, H. M.; Meijer, E. W., "The synthesis and characterization of dendritic molecules", Materials Science and Technology (1999), 20 (Synthesis of Polymers), 403-458; Tomalia, Donald A., "Dendrimer molecules", Scientific American (1995), 272(5), 62-6, WO 02/067343 A1 and WO 2005/026144 A1.

The synthesis of the units from groups 1 to 8 described above and the further emitting units is known to the person skilled in the art and is described in the literature, for example in WO 2005/014689 A2, WO 2005/030827 A1 and WO 2005/030828 A1. These documents and the literature cited therein are incorporated into the present application by way of reference.

It may additionally be preferred to use the polymers according to the invention not as the pure substance, but instead as a mixture (blend) together with further polymeric, oligomeric, dendritic or low-molecular-weight substances of any desired type. These may, for example, improve the electronic properties or themselves emit or likewise function as matrix material. Above and below, a "mixture" or "blend" denotes a mixture comprising at least one polymeric component. Besides the polymer according to the invention, preferred matrix materials for the blend are, for example, CBP (N,N-biscarbazolylbiphenyl), carbazole derivatives (for example in accordance with WO 05/039246, US 2005/0069729, JP 2004/288381, EP 1205527 or DE 102007002714), azacarbazoles (for example in accordance with EP 1617710, EP 1617711, EP 1731584, JP 2005/347160), ketones (for example in accordance with WO 04/093207), phosphine oxides, sulfoxides and sulfones (for example in accordance with WO 05/003253), oligophenylenes, aromatic amines (for example in accordance with US 2005/0069729), bipolar matrix materials (for example in accordance with WO 07/137725), silanes (for example in accordance with WO 05/111172), 9,9-diarylfluorene derivatives (for example DE 102008017591), azaboroles or boronic esters (for example in accordance with WO 06/117052).

The present invention furthermore relates to solutions and formulations comprising one or more compositions according to the invention in one or more solvents. The way in which solutions of this type can be prepared is known to the person skilled in the art and is described, for example, in WO 02/072714 A1, WO 03/019694 A2 and the literature cited therein.

Suitable and preferred solvents for formulations are, for example, toluene, anisole, xylene, methyl benzoate, dimethylanisole, mesitylene, tetralin, veratrol and tetrahydrofuran, as well as mixtures thereof.

These solutions can be used to produce thin polymer layers, for example by area-coating processes (for example spin coating) or by printing processes (for example ink-jet printing).

Compositions according to the invention comprising polymers having structural units of the formula I which additionally contain one or more polymerisable and thus crosslinkable groups are particularly suitable for the production of films or coatings, in particular for the production of structured coatings, for example by thermal or light-induced in-situ polymerisation and in-situ crosslinking, such as, for example, in-situ UV photopolymerisation or photopatterning. For applications of this type, particular preference is given to polymers according to the invention containing one or more polymerisable groups selected from acrylate, methacrylate, vinyl, epoxy and oxetane. It is possible here not only to use corresponding polymers as the pure substance, but also to use formulations or blends of these polymers as described above. These can be used with or without addition of solvents and/or binders. Suitable materials, processes and devices for the methods described above are described, for example, in WO 2005/083812 A2. Possible binders are, for example, polystyrene, polycarbonate, polyacrylate, polyvinylbutyral and similar, opto-electronically neutral polymers.

If the polymer which comprises structural units of the formula I or the preferred embodiments mentioned above is employed as matrix material for an emitting compound in an emitting layer, it is preferably employed in combination with one or more fluorescent materials (singlet emitters) or phosphorescent materials (triplet emitters). For the purposes of the present invention, phosphorescence is taken to mean the luminescence from an excited state of relatively high spin multiplicity, i.e. a spin state>1, in particular from an excited triplet state or from an MLCT mixed state.

The mixture comprising the polymer according to the invention or the preferred embodiment mentioned above and the emitting compound then comprises between 99 and 1% by weight, preferably between 98 and 60% by weight, particularly preferably between 97 and 70% by weight, in particular between 95 and 75% by weight, of the polymer according to the invention or of the preferred embodiment mentioned above, based on the entire mixture comprising emitter and matrix material. Correspondingly, the mixture comprises up to 99% by weight, preferably up to 40% by weight, particularly preferably up to 30% by weight and in particular up to 25% by weight, of the emitter, based on the entire mixture comprising emitter and matrix material. In addition, the mixture comprises at least 1% by weight, preferably 2% by weight, particularly preferably at least 3% by weight and in particular at least 5% by weight, of the emitter, based on the entire mixture comprising emitter and matrix material.

In the above-mentioned embodiment in which the polymer which comprises structural units of the formula (I) is employed in an emitting layer together with an emitting compound, the proportion of the emitting compound may, however, also be significantly smaller. In this case, the mixture preferably comprises at least 0.01% by weight of the emitter, based on the entire mixture, but preferably less than 5% by weight, particularly preferably less than 3% by weight and in particular less than 1.5% by weight, of the emitter, based on the entire mixture.

Suitable phosphorescent compounds are, in particular, compounds which emit light, preferably in the visible region, on suitable excitation and in addition contain at least one atom having an atomic number of greater than 36 and less than 84, particularly preferably greater than 56 and less than 80.

Examples of the emitters described above are revealed by WO 00/70655, WO 01/41512, WO 02/02714, WO 02/15645, EP 1191613, EP 1191612, EP 1191614, WO 05/033244 or DE 102008015526. In general, all phosphorescent complexes as used in accordance with the prior art for phosphorescent OLEDs and as are known to the person skilled in the art in the area of organic electroluminescence are suitable, and the person skilled in the art will be able to use further phosphorescent complexes without an inventive step.

For the purposes of the present invention, the emitter compound in the composition according to the invention is preferably a triplet emitter, a singlet emitter or a singlet exciton-generating group. The triplet emitter is preferably a green-emitting triplet emitter. The triplet emitter may likewise be a blue or red triplet emitter.

In a further embodiment according to the invention, the triplet emitter preferably comprises an organometallic connecting unit. The organometallic connecting unit is preferably an organometallic coordination compound. An organometallic coordination compound is taken to mean a compound having a metal atom or ion in the centre of the compound surrounded by an organic compound as ligand. In addition, an organometallic coordination compound is characterised in that a carbon atom of the ligand is bonded to the central metal via a coordination bond.

The triplet emitters preferably contain only chelating ligands, i.e. ligands which coordinate to the metal via at least two bonding sites; the use of two or three bidentate ligands, which may be identical or different, is particularly preferred. The preference for chelating ligands is due to the higher stability of chelate complexes.

The triplet emitter preferably has a structure of the formula VII:

formula VII where the following applies to the symbols and indices used:

M is on each occurrence, identically or differently, a main-group metal, transition metal or lanthanoid having an atomic number>36;

DCy is on each occurrence, identically or differently, a cyclic group which contains at least one donor atom, i.e. an atom having a free electron pair, preferably nitrogen or phosphorus, via which the cyclic group is bonded to the metal, and which may carry one or more substituents $R^4$; the groups DCy and CCy are connected to one another via a covalent bond and may have further links to one another via the radicals $R^4$ and/or $R^5$;

CCy is on each occurrence, identically or differently, a cyclic group which contains a carbon atom via which the cyclic group is bonded to the metal, and which may carry one or more substituents $R^4$;

L is on each occurrence, identically or differently, a bidentate-chelating ligand, preferably a monoanionic, bidentate-chelating ligand;

$R^4$ is on each occurrence, identically or differently, H, F, Cl, Br, I, $NO_2$, CN, a straight-chain, branched or cyclic alkyl or alkoxy group having 1 to 40 C atoms, where one or more non-adjacent $CH_2$ groups may be replaced by C=O, C=S, C=Se, C=$NR^5$, $-R^5C=CR^5-$, $-C\equiv C-$, $-O-$, $-S-$, $-NR^5-$, $Si(R^5)_2$ or $-CONR^5-$ and where one or more H atoms may be replaced by F, Cl, Br, I, CN, $NO_2$, or an aromatic or heteroaromatic ring system having 5 to 40 aromatic ring atoms, which may be substituted by one or more non-aromatic radicals $R^4$; a plurality of substituents $R^4$ here, both on the same ring and also on the two different rings, may together in turn form a further mono- or polycyclic, aliphatic or aromatic ring system;

$R^5$ is, identically or differently on each occurrence, H, an aliphatic hydrocarbon radical having 1 to 20 C atoms or an aromatic hydrocarbon radical having 6 to 20 C atoms;

m is on each occurrence 1, 2 or 3, preferably 2 or 3, particularly preferably 3;

n is on each occurrence 0, 1 or 2, preferably 0 or 1, particularly preferably 0.

Preference is likewise given to multinuclear triplet emitters and metal clusters whose common feature is more than one metallic centre.

The units of the formula VII may have a symmetrical or asymmetrical structure.

In a preferred embodiment of the present invention, the units of the formula VII have a symmetrical structure. This preference is due to the easier synthetic accessibility of the compounds. Thus, units of the formula VII may preferably be homoleptic metal complexes, i.e. metal complexes which have only one type of ligand.

In a further preferred embodiment of the present invention, the units of the formula VII have an asymmetrical structure. This may offer advantages in the case of the emission properties if the emission only comes from one of the ligands. Thus, units of the formula VII may preferably be heteroleptic complexes, i.e. metal complexes which have more than one different ligand.

Preferred metals M are selected from the group of the transition metals having an atomic number>36; particularly preferred metals M are selected from the group of the transition metals having an atomic number>50. The emitter compound is preferably a metal complex containing a metal selected from the group consisting of the transition metals, the rare earths, the lanthanoids and the actinoids, preferably Ir, Ru, Os, Eu, Au, Pt, Cu, Zn, Mo, W, Rh, Pd and Ag, particularly preferably Ir.

It is furthermore preferred for the organic ligand to be a chelate ligand. A chelate ligand is taken to mean a bi- or polydentate ligand, which may correspondingly be bonded to the central metal via two or more atoms.

In a further embodiment according to the invention, it is preferred for a mixture to comprise a polymer according to the invention, a triplet emitter, which is either present in the polymer according to the invention or, as in the above-mentioned embodiments, has been admixed as low-molecular-weight substance, and further low-molecular-weight substances. These low-molecular-weight substances may have the same functionalities as mentioned for possible monomer units from groups 1 to 8.

In the composition according to the invention, the polymer to emitter compound weight ratio should preferably be a) 99.1:0.01 to 98:2, particularly preferably b) 60:40 to 95:5, and in particular c) 80:20. For triplet emitters, range a) is preferred. For singlet emitters, ranges b) and c) are preferred.

In a further embodiment, it is preferred for the composition according to the invention to comprise one or more solvents. This is a liquid formulation which is suitable for coating a support or a layer of an opto-electronic device which has already been deposited. The present invention likewise relates to a formulation of this type. Suitable and preferred solvents for the formulations according to the invention are, for example, toluene, anisole, xylene, methyl benzoate, dimethylanisole, mesitylene, tetralin, veratrol and tetrahydrofuran, as well as mixtures thereof.

The composition according to the invention is suitable for use in an opto-electronic device. The composition is preferably in the form of a layer in the opto-electronic device. The way in which such layers can be produced, for example by spin coating, is known to the person skilled in the art.

The present invention furthermore relates to an opto-electronic device preferably comprising a cathode, an anode and at least one composition as defined above. The composition according to the invention is preferably in the form of a layer and is arranged between the cathode and the anode. However, further layers may also be present in the opto-electronic device. It is likewise possible for interlayers, which have, for example, an exciton-blocking function, to be introduced between two emitting layers. However, it should be pointed out that each of these layers does not necessarily have to be present. The organic electroluminescent device may comprise one emitting layer or a plurality of emitting layers, where at least one emitting layer comprises at least one composition according to the invention. If a plurality of emission layers are present, these preferably have in total a plurality of emission maxima between 380 nm and 750 nm, resulting overall in white emission, i.e. various emitting compounds which are able to fluoresce or phosphoresce are used in the emitting layers. Particular preference is given to three-layer systems, where the three layers exhibit blue, green and orange or red emission (for the basic structure see, for example, WO 05/011013).

In an embodiment of the present invention, it is therefore preferred for the opto-electronic device to comprise further layers selected from a hole-transport, hole-injection, emitter, electron-transport, electron-injection, charge-blocking, charge-generation layer and/or an interlayer.

The cathode preferably comprises metals having a low work function, metal alloys, metal complexes or multilayered structures comprising various metals, such as, for example, alkaline-earth metals, alkali metals, main-group metals or lanthanoids (for example Ca, Ba, Mg, Al, In, Mg, Yb, Sm, etc.). In the case of multilayered structures, further metals which have a relatively high work function, such as, for example, Ag, can also be used in addition to the said metals, in which case combinations of the metals, such as, for example, Ca/Ag or Ba/Ag, are generally used. It may also be preferred to introduce a thin interlayer of a material having a high dielectric constant between a metallic cathode and the organic semiconductor. Suitable for this purpose are, for example, alkali-metal or alkaline-earth metal fluorides, but also the corresponding oxides (for example LiF, $Li_2O$, $BaF_2$, MgO, NaF, etc.). The layer thickness of this layer is preferably between 1 and 10 nm.

The anode preferably comprises materials having a high work function. The anode preferably has a potential greater than 4.5 eV (against vacuum level). Suitable for this purpose are on the one hand metals having a high redox potential, such as, for example, Ag, Pt or Au. On the other hand, metal/metal oxide electrodes (for example Al/Ni/$NiO_x$, Al/$PtO_x$) may also be preferred. For some applications, at least one of the electrodes must be transparent in order to facilitate either irradiation of the organic material (O-SCs) or the coupling-out of light (OLEDs/PLEDs, O-lasers). A preferred structure uses a transparent anode. Preferred anode materials here are conductive, mixed metal oxides. Particular preference is given to indium tin oxide (ITO) or indium zinc oxide (IZO). Preference is furthermore given to conductive, doped organic materials, in particular conductive, doped polymers, such as, for example, PEDOT/PSS or PANI.

The opto-electronic device is preferably an organic electroluminescent device (OLED), a polymeric electroluminescent device (PLED), an organic integrated circuit (O-IC), an organic field-effect transistor (O-FET), an organic thin-film transistor (O-TFT), an organic light-emitting transistor (O-LET), an organic solar cell (O-SC), an organic optical detector, an organic photoreceptor, an organic field-quench device (O-FQD), a light-emitting electrochemical cell (LEC) or an organic laser diode (O-laser).

In an embodiment of the present invention, the opto-electronic device preferably comprises, as anode, an ITO layer, preferably on a glass substrate or a polymer. A buffer layer, preferably PEDOT/PSS or PANI, is located on the ITO layer, and on top of this is an interlayer. At least one layer which comprises the composition according to the invention is located on this. A cathode, preferably a Ba/Al cathode, is applied to this layer. The opto-electronic device is hermetically sealed.

The invention is explained in greater detail below with reference to working examples, but these should not be taken to be restrictive of the scope of the invention. In addition, reference is made here to the figures.

WORKING EXAMPLES

Examples 1 to 7

Preparation of the Monomers

Example 1

Preparation of Compound 4 (M1)

Compound 4 is prepared as follows:

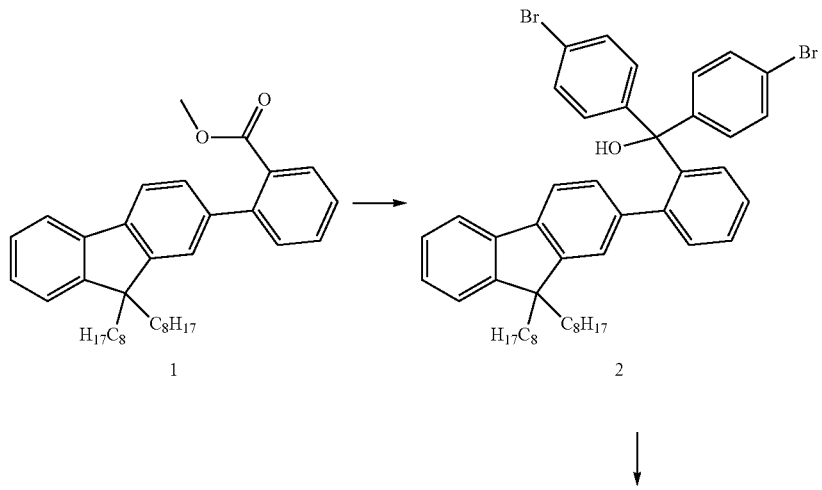

-continued

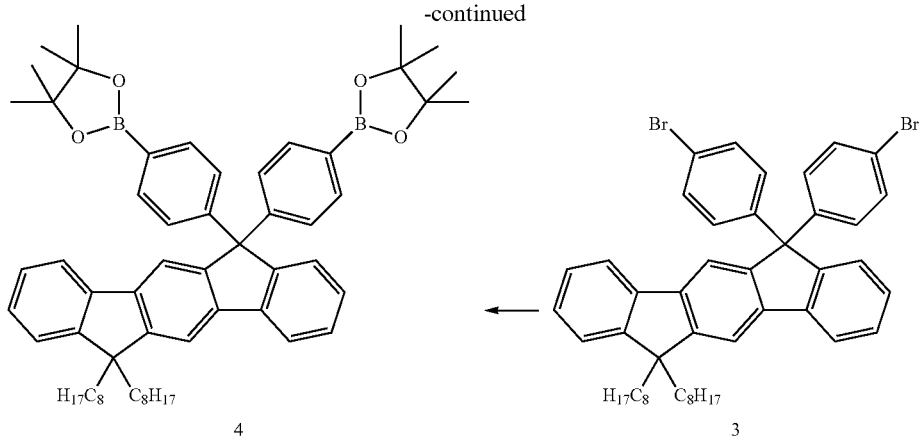

4

3

1.1 Compound 2

2

1.2 Compound 3

3

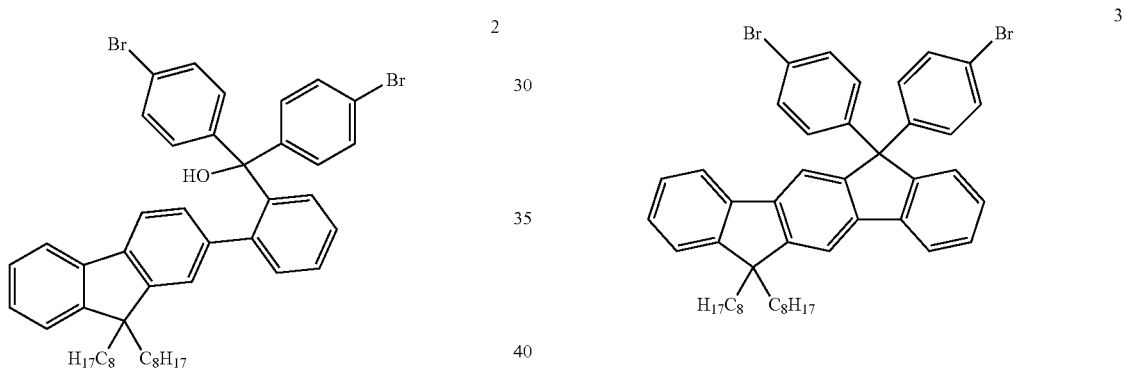

104.3 g (2 molar equivalents, 0.442 mol) of 1,4-dibromobenzene are initially introduced in 300 ml of THF and cooled to −75° C. in an acetone/dry-ice bath. 117 ml (2 molar equivalents, 0.442 mol) of n-butyllithium (2.5 M in hexane) are added dropwise at such a rate that the internal temperature does not exceed −69° C., and the mixture is subsequently stirred at −72° C. for a further 1 hour. 116 g (1 molar equivalent, 0.221 mol) of compound 1 are then dissolved in 220 ml of THF and slowly added dropwise at −72° C. at such a rate that the internal temperature does not exceed −69° C. The reaction solution is stirred for a further hour at −70° C. and overnight at room temperature.

120 ml of acetic acid (50%) are added to the batch. The phases are separated. The aqueous phase is extracted with heptane. The combined organic phases are extracted with water, dried over $Na_2SO_4$, filtered and evaporated under reduced pressure.

$^1$H NMR ($CDCl_2$, δ (ppm), (Hz)): 0.51 (s broad, 4H), 0.81 (t, 6H, J=7.25), 0.94-1.25 (m, 20H), 1.55-1.85 (m, 4H), 6.73 (d, 1H, J=8.0), 6.87-6.90 (m, 2H), 6.95-7.05 (m broad, 4H), 7.21 (d, 1H, J=7.55), 7.24 (d, 1H, J=7.75), 7.28-7.36 (m, 4H), 7.42 (d, 4H, J=8.6), 7.56 (d, 1H, 7.75), 7.66-7.68 (m, 1H)

177.4 g (1 molar equivalent, 0.22 mol) of compound 2 are dissolved in 353.2 ml (2.8 molar equivalents, 6.1 mol) of acetic acid and warmed to reflux. 19.6 ml (1.1 molar equivalents, 0.24 mol) of concentrated hydrochloric acid are added under reflux, and the mixture is heated under reflux for 1.5 hours. After a TLC check (heptane/ethyl acetate), 2×2 ml of concentrated hydrochloric acid are metered in, reaction time 3 hours. When the reaction is complete, 25 ml of water are carefully added. A further 50 ml of water are subsequently added for phase separation. The mixture is extracted with dichloromethane (DCM), and the combined organic phases are then extracted with water and $NaHCO_3$, dried over sodium sulfate, filtered and evaporated under reduced pressure.

Purification is carried out by recrystallisation (acetonitrile/toluene) and gives a white solid (99%).

$^1$H NMR ($CDCl_2$, δ (ppm), J (Hz)): 0.65-0.75 (m, 4H), 0.79 (t, 6H, J=7.25), 0.99-1.25 (m, 20H), 1.98-2.01 (m, 4H), 7.10 (d, 4H, J=8.75), 7.26-7.29 (m, 3H), 7.33-7.41 (m, 7H), 7.57 (s, 1H), 7.60-7.62 (m, 1H), 7.71 (s, 1H), 7.84 (d, 1H, 7.55)

1.3 Compound 4

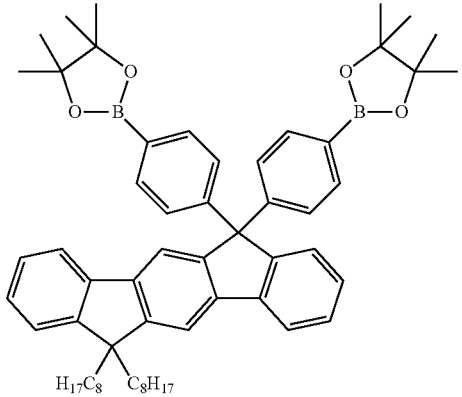

250 ml of dioxane, 19.33 g (2 molar equivalents, 0.076 mol) of bis(pinacolato)diborane and 10.83 g (2.9 molar equivalents, 0.11 mol) of potassium acetate are added to 30 g (1 molar equivalent, 0.038 mol) of compound 3. 1.11 g (1.4 mmol) of 1,1-bis(diphenylphosphine)ferrocenepalladium(II) chloride (complex with dichloromethane (1:1), Pd: 13%) are subsequently added. The batch is heated to 110° C. After a TLC check, the batch is cooled to room temperature, and 200 ml of water are added.

A further 50 ml of water are subsequently added for phase separation. The mixture is extracted with ethyl acetate, and the combined organic phases are then dried over sodium sulfate, filtered and evaporated under reduced pressure.

Purification is carried out over a column (heptane/ethyl acetate) and by recrystallisation (heptane) and gives a white solid (100%).

$^1$H NMR (CDCl$_2$, δ (ppm), J (Hz)): 0.65-0.75 (m, 4H), 0.80 (t, 6H, J=7.25), 0.99-1.23 (m, 20H), 1.28 (s, 24H), 1.98-2.01 (m, 4H), 7.23 (d, 4H, J=8.2), 7.26-7.28 (m, 3H), 7.32-7.34 (m, 1H), 7.37-7.40 (m, 2H), 7.57-7.59 (m, 1H), 7.62 (s, 1H), 7.68 (d, 4H, J=8.25), 7.71 (s, 1H), 7.84 (d, 1H, 7.40)

Example 2

Preparation of Compound 8 (M2)

Compound 8 is prepared as follows:

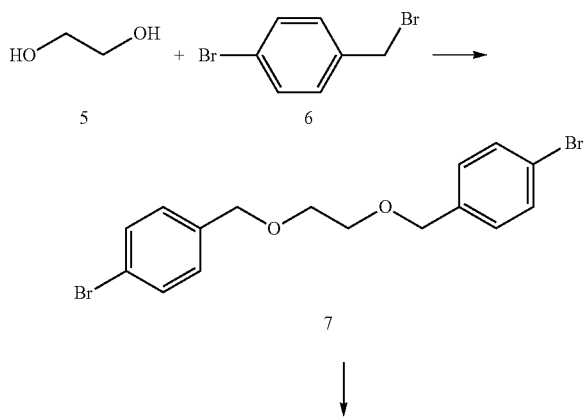

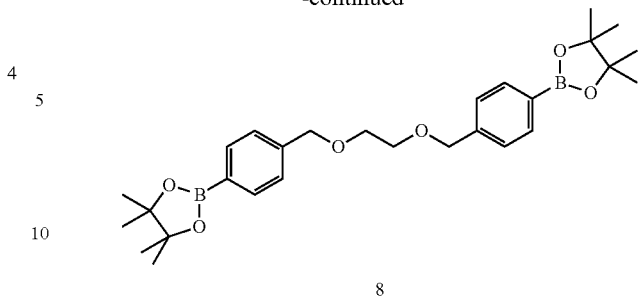

2.1 Compound 7

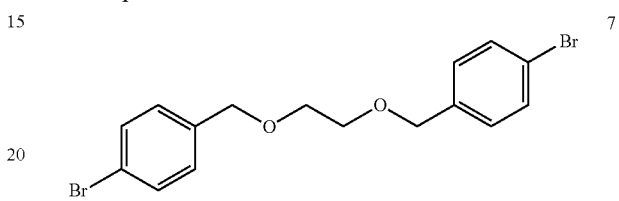

80.02 g of NaH (10 molar equivalents, 2.0 mol) are initially introduced in 600 ml of THF, 11.3 ml of ethylene glycol (1 molar equivalent, 0.2 mol) in 200 ml of THF are added at about 0° C. under a protective gas, and, after a stirring time of 1 hour at 0° C., a solution of 100 g of 4-bromobenzyl bromide (2 molar equivalents, 0.4 mmol) in 300 ml of THF is slowly added dropwise at 0° C. The batch is stirred under reflux for 36 hours, subsequently cooled at 0° C., and 200 ml of water are slowly added dropwise at 0° C. The aqueous phase is extracted by shaking three times with DCM. The combined organic phases are dried over Na$_2$SO$_4$, filtered and evaporated in a rotary evaporator. Recrystallisation from ethanol gives product 7 (30.6 g, 38%).

$^1$H NMR (CDCl$_3$, δ (ppm), J (Hz)): 3.64 (s, 4H), 4.52 (s, 4H), 7.21 (d, 4H, J=8.4), 7.46 (d, 4H, J=8.4)

2.2 Compound 8

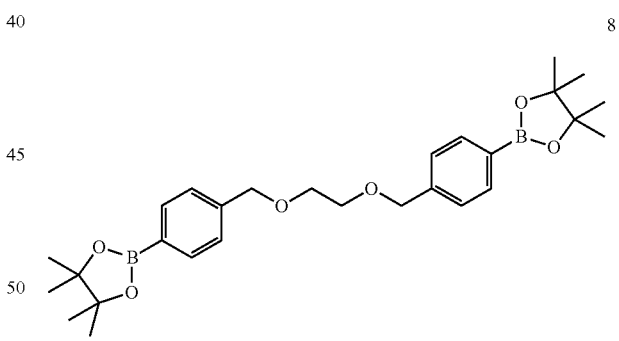

200 ml of THF, 52.53 g (2.2 molar equivalents, 206.9 mmol) of bis(pinacolato)diborane in 100 ml of THF, 60.78 g (6.6 molar equivalents, 619.3 mmol) of potassium acetate in 200 ml of THF and 2.71 g (0.04 molar equivalent, 3.7 mmol) of 1,1-bis(diphenylphosphine)ferrocenepalladium(II) chloride (complex with dichloromethane (1:1), Pd: 13%) are added to 37.29 g (1 molar equivalent, 93.2 mmol) of compound 7. The batch is stirred at 80° C. for 5 hours, and 200 ml of ice-water are slowly added dropwise. The aqueous phase is extracted by shaking three times with DCM. The combined organic phases are dried over Na$_2$SO$_4$, filtered and evaporated in a rotary evaporator. Recrystallisation from heptane gives product 8 (9.1 g, 20%).

$^1$H NMR (CDCl$_2$, δ (ppm), J (Hz)): 1.32 (s, 24H), 3.65 (s, 4H), 4.57 (s, 4H), 7.35 (d, 4H, J=7.9), 7.79 (d, 4H, J=7.9)

Example 3

Preparation of Compound 13 (M3)

Compound 13 is prepared as follows:

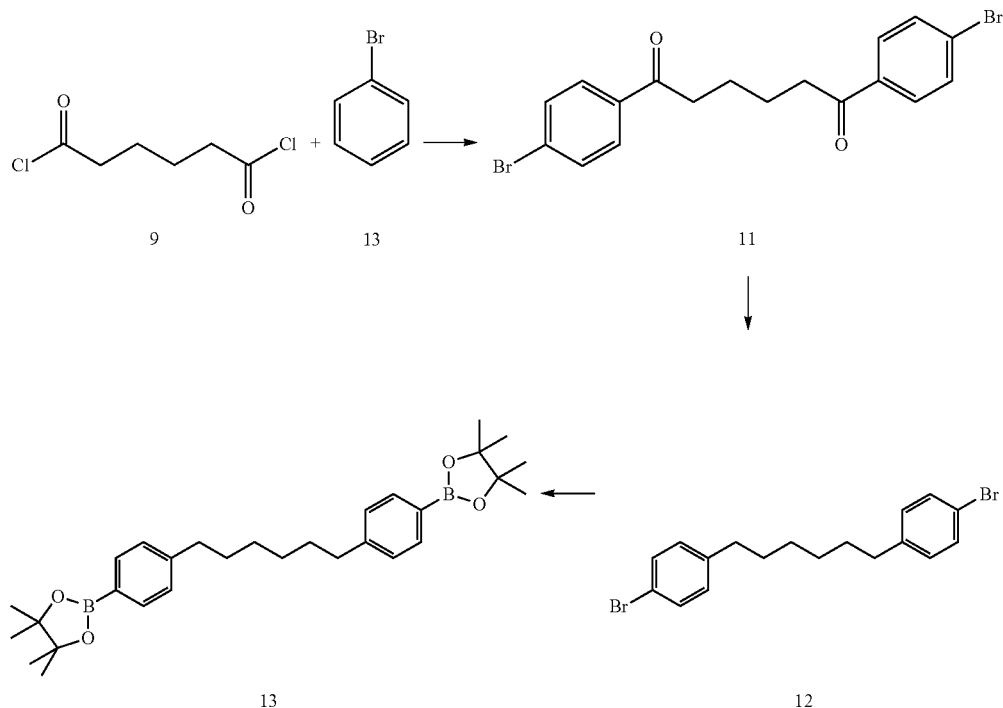

3.1 Compound 11

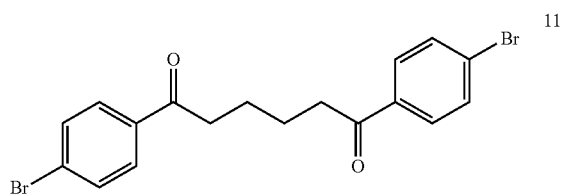 [SMILES: O=C(CCCCC(=O)c1ccc(Br)cc1)c1ccc(Br)cc1]

218.55 g of aluminium chloride (2.4 molar equivalents, 1.64 mol) are initially introduced in 288 ml (4.0 molar equivalents, 2.73 mol) of bromobenzene. 100 ml of adipoyl chloride (1 molar equivalent, 0.68 mmol) are added dropwise at room temperature under a protective gas. The batch is stirred at 50° C. for 1 hour, and 200 ml of water are slowly added dropwise at 0° C. The aqueous phase is extracted by shaking three times with DCM. The combined organic phases are dried over $Na_2SO_4$, filtered and evaporated in a rotary evaporator. Recrystallisation from ethanol gives product 11 (74.0 g, 26%).

$^1$H NMR (CDCl$_3$, δ (ppm), J (Hz)): 1.81-1.85 (m, 4H), 2.97-3.02 (m, 4H), 7.60 (d, 4H, J=8.6), 7.81 (d, 4H, J=8.6)

3.2 Compound 12

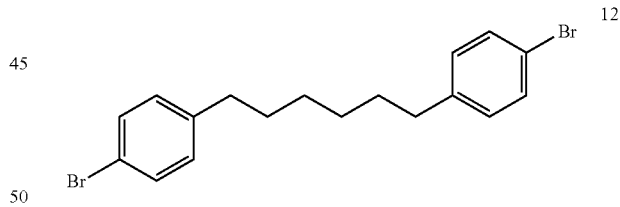

68.20 g (1 molar equivalent, 0.16 mol) of compound 11 and 72.38 g (8 molar equivalents, 1.29 mol) of KOH are initially introduced in 1 l of triethylene glycol. 39.57 g of hydrazine hydrate (7.5 molar equivalents, 1.21 mol) are slowly added dropwise at room temperature under a protective gas. The batch is stirred at 160° C. for 28 hours, and 400 ml of water are slowly added dropwise at 0° C. The aqueous phase is extracted by shaking three times with DCM. The combined organic phases are dried over $Na_2SO_4$, filtered and evaporated in a rotary evaporator. Filtration through silica gel gives product 12 (10.3 g, 16%).

$^1$H NMR (CDCl$_3$, δ (ppm), J (Hz)): 1.29-1.35 (m, 4H), 1.56-1.60 (m, 4H), 2.52-2.55 (m, 4H), 7.02 (d, 4H, J=8.4), 7.38 (d, 4H, J=8.4)

3.3 Compound 13

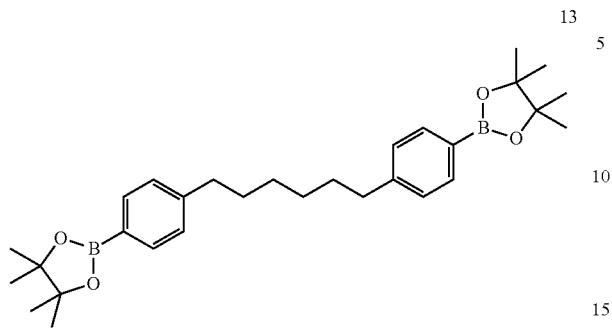

55 ml of THF, 14.22 g (2.2 molar equivalents, 56 mmol) of bis(pinacolato)-diborane in 30 ml of THF, 16.19 g (6.6 molar equivalents, 165 mmol) of potassium acetate in 50 ml of THF and 0.73 g (0.04 molar equivalent, 1 mmol) of 1,1-bis(diphenylphosphine)ferrocenepalladium(II) chloride (complex with dichloromethane (1:1), Pd: 13%) are added to 10.10 g (1 molar equivalent, 25 mmol) of compound 12. The batch is stirred at 80° C. for 3 hours, and 200 ml of ice-water are slowly added dropwise. The aqueous phase is extracted by shaking three times with DCM. The combined organic phases are dried over $Na_2SO_4$, filtered and evaporated in a rotary evaporator. Recrystallisation from heptane gives product 13 (5.10 g, 19%).

$^1$H NMR ($CDCl_3$, δ (ppm), J (Hz)): 1.33 (s, 24H), 1.57-1.61 (m, 4H), 2.58-2.61 (m, 4H), 7.17 (d, 4H, J=7.9), 7.72 (d, 4H, J=7.9)

Example 4

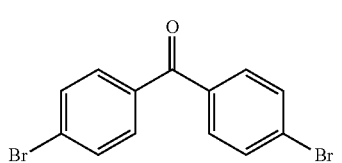
M4

Example 5

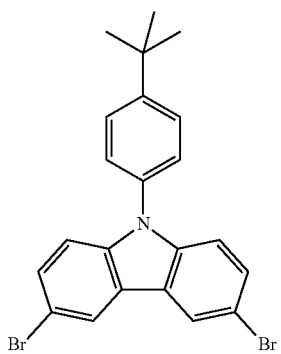
M5

Example 6

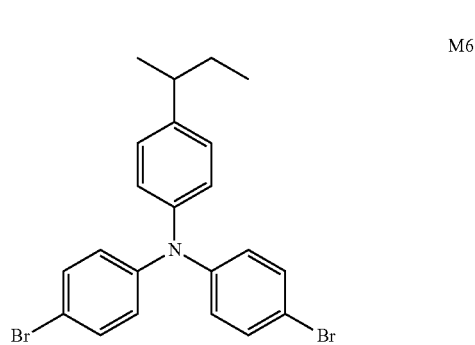 [SMILES: CCC(C)c1ccc(N(c2ccc(Br)cc2)c2ccc(Br)cc2)cc1]
M6

Monomers M1, M2 and M3 (Examples 1, 2 and 3) are monomers which represent the conjugation-interrupting unit A and/or $A^1$ in a polymer prepared therefrom. Monomers M4, M5 and M6 (Examples 4, 5, 6) are, by contrast, monomers which represent the opto-electronic functional group FG and/or $FG^1$ in a polymer prepared therefrom.

Examples 7 to 17

Preparation of the Polymers

Polymers P1 to P9 according to the invention and comparative polymers C1 and C2 are synthesised using the following monomers (percent data=mol %) by SUZUKI coupling in accordance with WO 03/048225 A2.

Example 7

Comparative Polymer C1

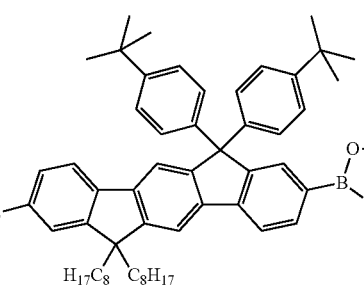

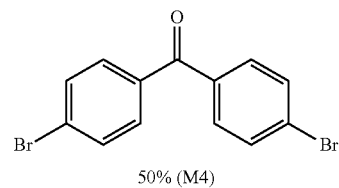

50% (M4)

Example 8
Comparative Polymer C2
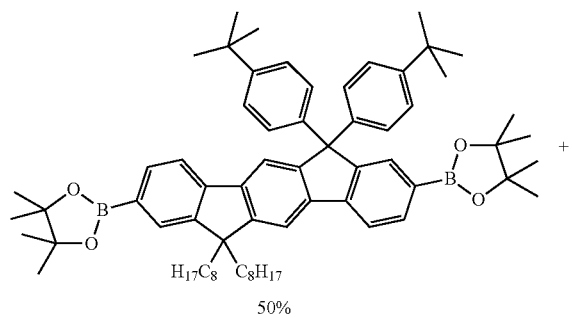
50%
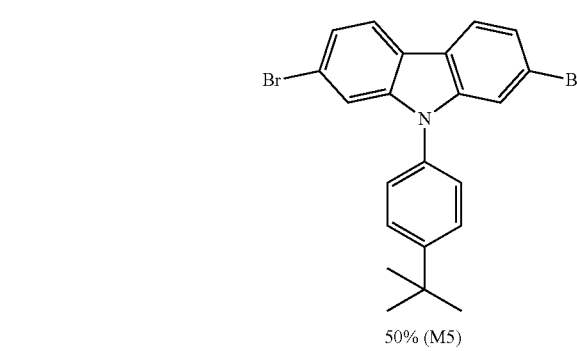
50% (M5)
Example 9
Polymer P1
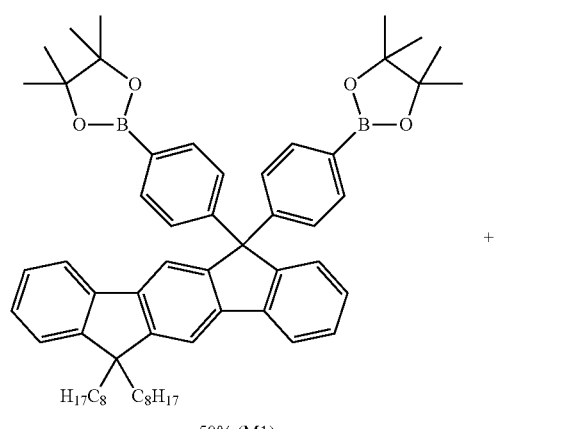
50% (M1)
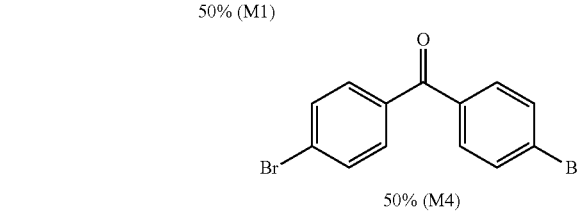
50% (M4)
Example 10
Polymer P2
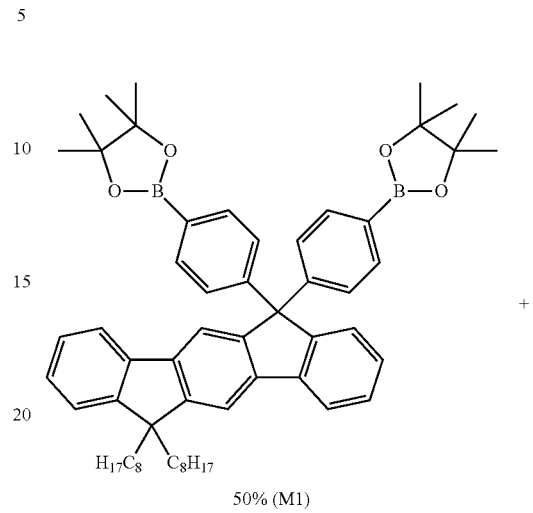
50% (M1)
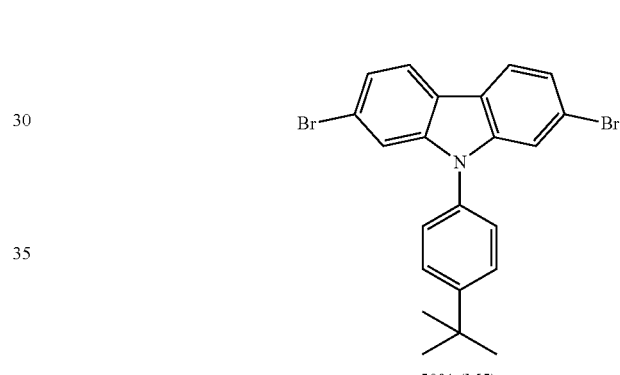
50% (M5)
Example 11
Polymer P3
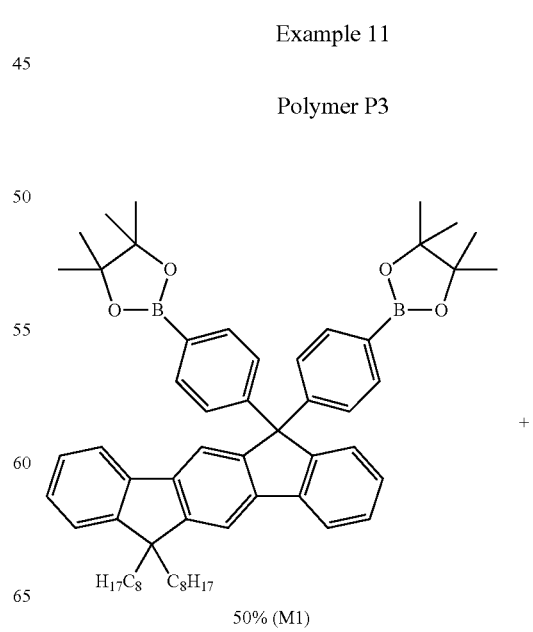
50% (M1)

-continued
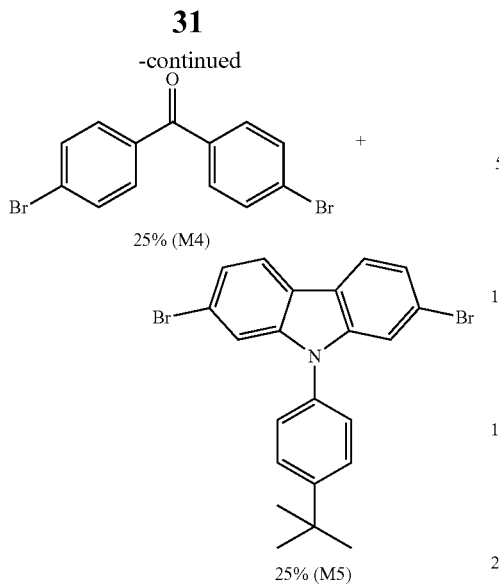
Example 12
Polymer P4
Example 13
Polymer P5
Example 14
Polymer P6
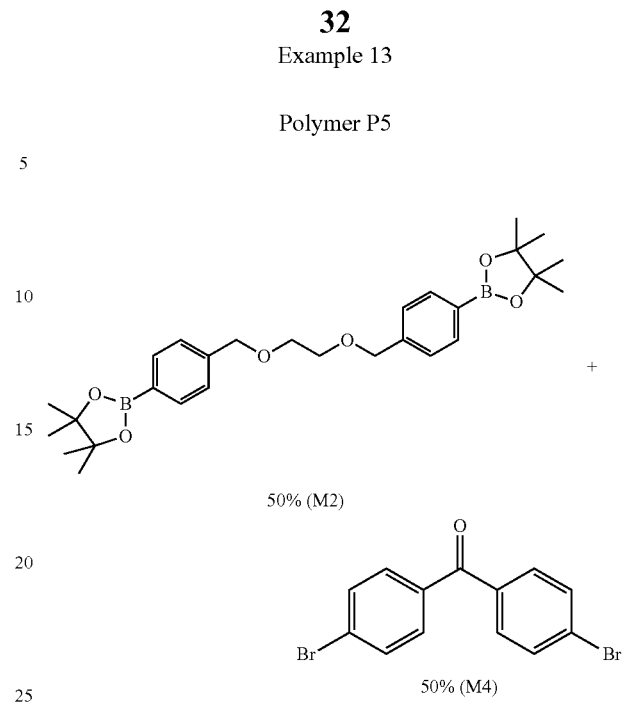
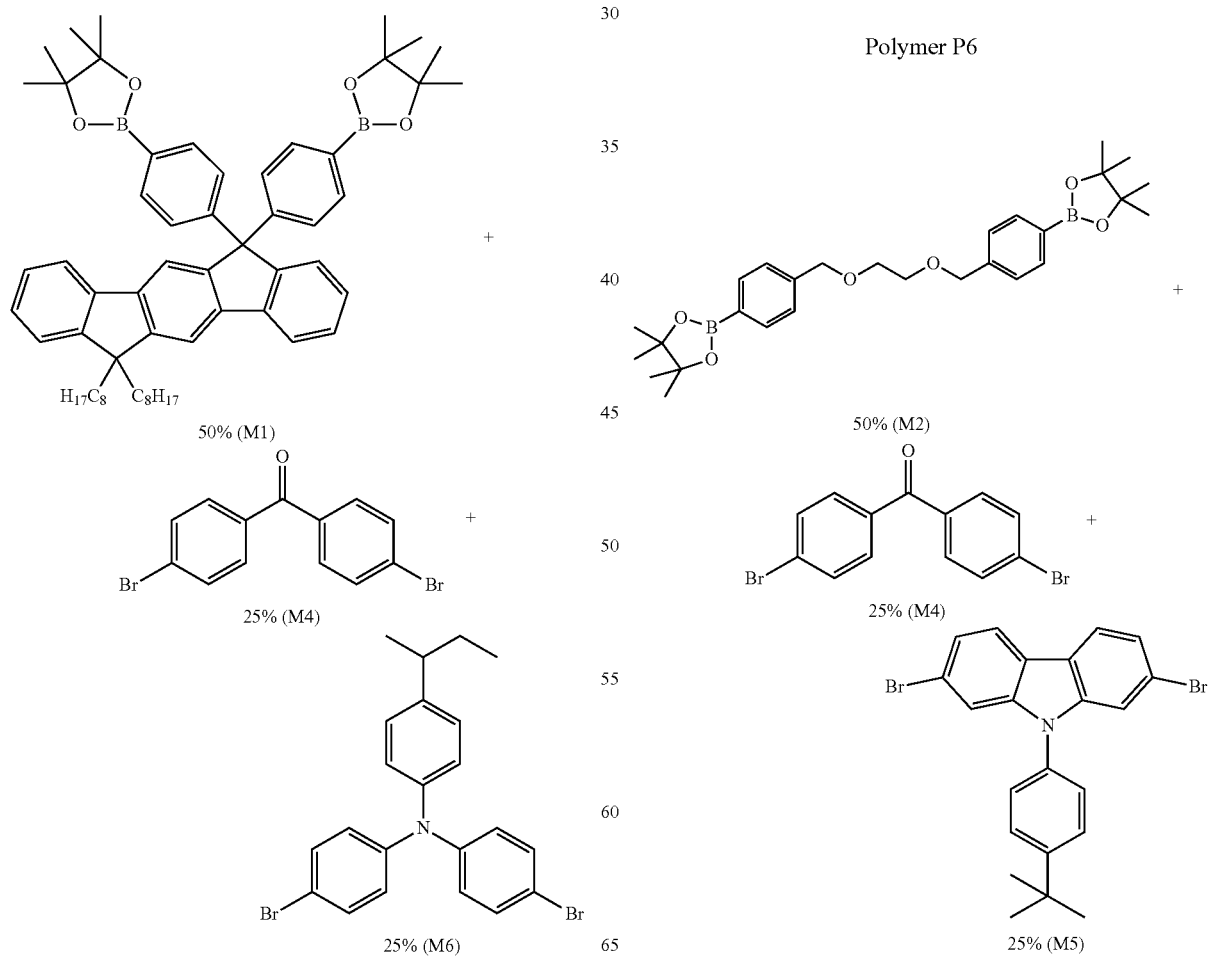

33
Example 15

Polymer P7

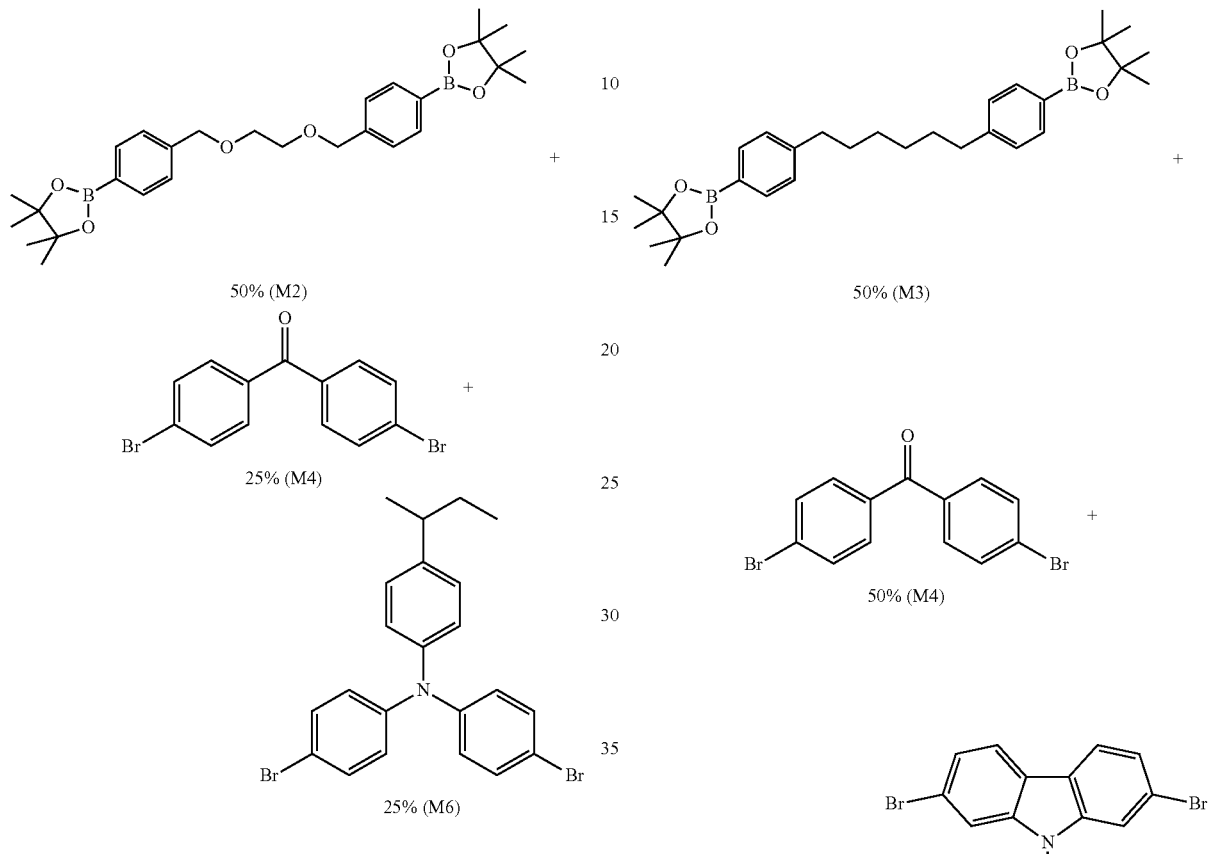

34
Example 17

Polymer P9

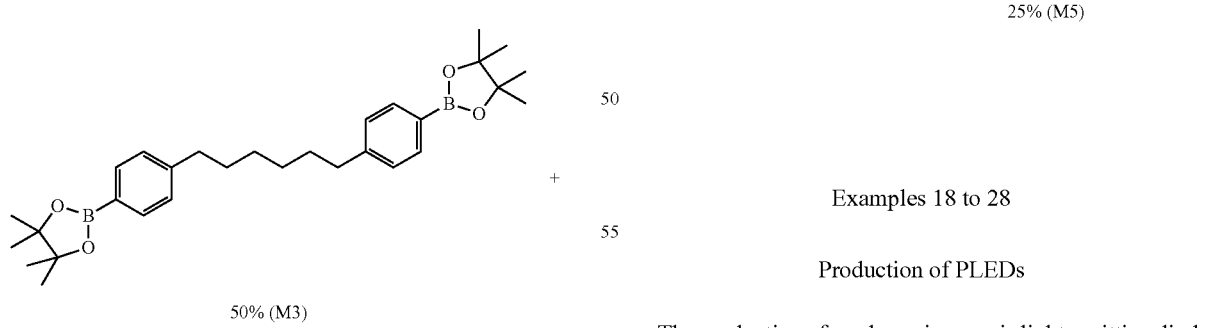

Examples 18 to 28

Production of PLEDs

The production of a polymeric organic light-emitting diode (PLED) has already been described a number of times in the literature (for example in WO 2004/037887 A2). In order to explain the present invention by way of example, PLEDs are produced by spin coating using polymers P1 to P9 according to the invention and using comparative polymers C1 and C2. In order to obtain green-emitting triplet emission, T1 is added to the solutions of the triplet emitters in a concentration of 20% by weight.

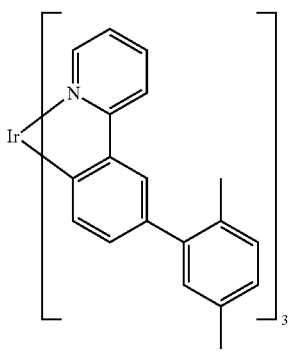

A typical device has the structure depicted in FIG. 1.

Figure 2:
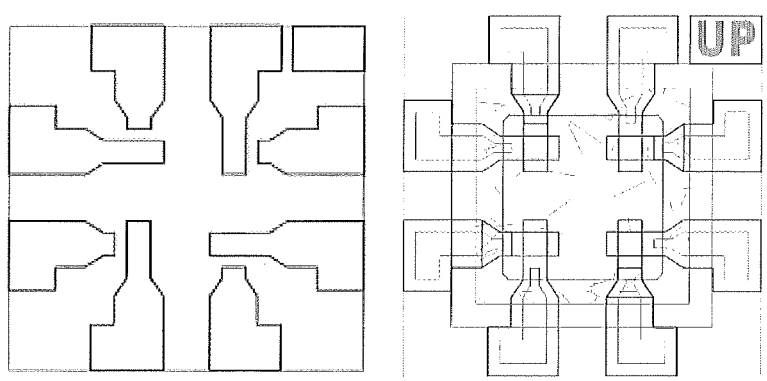

Especially manufactured substrates from Technoprint are used in a layout designed specifically for this purpose (FIG. 2, diagram on the left: ITO structure applied to the glass support, diagram on the right: complete electronic structure with ITO, vapour-deposited cathode and optional metallisation of the leads). The ITO structure (indium tin oxide, a transparent, conductive anode) is applied to soda-lime glass by sputtering in a pattern such that 4 pixels measuring 2×2 mm are obtained with the cathode vapour-deposited at the end of the production process.

The substrates are cleaned with deionised water and a detergent (Deconex 15 PF) in a clean room and then activated by UV/ozone plasma treatment. An 80 nm layer of PEDOT (PEDOT is a polythiophene derivative (Baytron P VAI 4083sp.) from H. C. Starck, Goslar, which is supplied as an aqueous dispersion) is then applied by spin coating, likewise in a clean room. The spin rate required depends on the degree of dilution and the specific spin-coater geometry (typical for 80 nm: 4500 rpm). In order to remove residual water from the layer, the substrates are dried by heating on a hotplate at 180° C. for 10 minutes. Then, under an inert-gas atmosphere (nitrogen or argon), firstly 20 nm of an interlayer (typically a hole-dominated polymer, here HIL-012 from Merck) and then 80 nm of the polymer layers are applied from toluene solutions (concentration of interlayer 5 g/l, for polymers P1 to P9, C1 and C2 between 8 and 10 g/l and thus 2 to 2.5 g/l of T1). The two layers are dried by heating at 180° C. for at least 10 minutes. The Ba/Al cathode is then vapour-deposited in the pattern indicated through a vapour-deposition mask (high-purity metals from Aldrich, particularly barium 99.99% (Order No. 474711); vapour-deposition units from Lesker or others, typical vacuum level $5\times10^{-6}$ mbar). Finally, the device is encapsulated in order to protect, in particular, the cathode against air and atmospheric moisture and then characterised.

Figure 3:
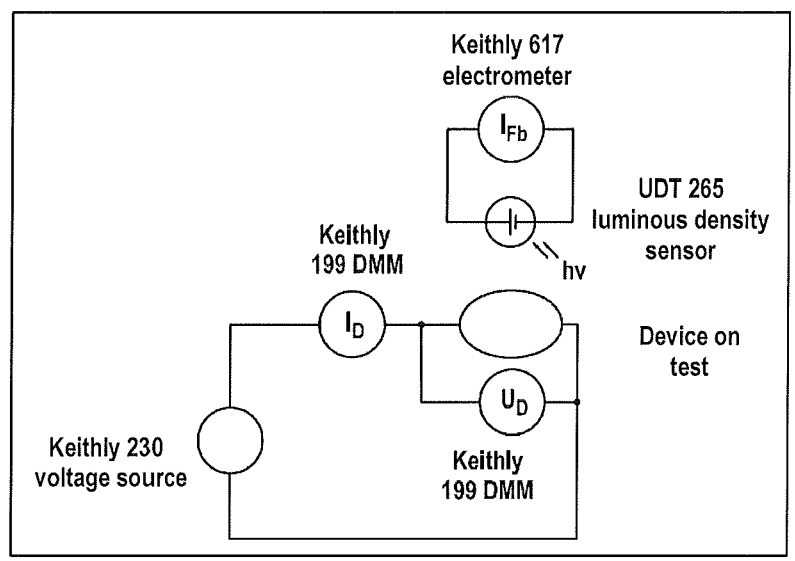

To this end, the devices are clamped into holders manufactured specifically for the substrate size and provided with spring contacts. A photodiode with eye response filter can be placed directly on the measurement holder in order to exclude influences from extraneous light. The typical measurement set-up is depicted in FIG. 3.

The voltages are typically increased from 0 to max. 20 V in 0.2 V steps and reduced again. For each measurement point, the current through the device and the photocurrent obtained are measured by the photodiode. In this way, the IUL data of the test devices are obtained. Important parameters are the maximum efficiency measured ("max. eff." in cd/A) and the voltage required for 100 cd/m$^2$.

In order, in addition, to know the colour and the precise electroluminescence spectrum of the test devices, the voltage required for 100 cd/m$^2$ is applied again after the first measurement, and the photodiode is replaced by a spectrum measurement head. This is connected to a spectrometer (Ocean Optics) by an optical fibre. The colour coordinates (CIE: Commission Internationale de l'Éclairage, standard observer from 1931) can be derived from the measured spectrum.

The results obtained on use of polymers P1 to P9 and comparative polymers C1 and C2 with the triplet emitter T1 in PLEDs are summarised in Table 1.

TABLE 1

| Ex. | Polymer | Max. eff. [cd/A] | U @ 100 cd/m$^2$ [V] | CIE [x/y] |
|-----|---------|------------------|----------------------|-----------|
| 18  | C1      | 0.34             | 8.2                  | 0.38/0.55 |
| 19  | C2      | 0.16             | 9.5                  | 0.39/0.56 |
| 20  | P1      | 28.4             | 5.3                  | 0.35/0.61 |
| 21  | P2      | 15.0             | 9.1                  | 0.35/0.61 |
| 22  | P3      | 31.2             | 5.8                  | 0.34/0.62 |
| 23  | P4      | 17.8             | 5.6                  | 0.33/0.62 |
| 24  | P5      | 17.4             | 5.7                  | 0.34/0.62 |
| 25  | P6      | 18.1             | 5.7                  | 0.34/0.62 |
| 26  | P7      | 11.0             | 4.1                  | 0.34/0.62 |
| 27  | P8      | 21.6             | 5.2                  | 0.35/0.61 |
| 28  | P9      | 27.4             | 5.2                  | 0.33/0.62 |

As can be seen from the results, polymers P1 to P9 according to the invention represent a significant improvement compared with the comparable polymers in accordance with the prior art.

The invention claimed is:

1. Composition comprising at least one triplet emitter compound and at least one polymer used as matrix material for the triplet emitter compound, characterised in that the polymer comprises at least one structural unit of the general formula I,

where the following applies to the symbols and indices used:

A is on each occurrence, independently of one another, a conjugation-interrupting unit selected from the group consisting of A-1d to A1p,

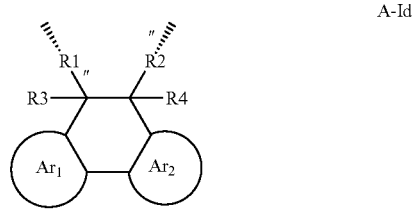

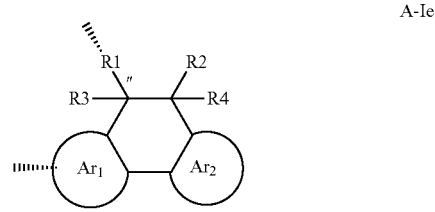

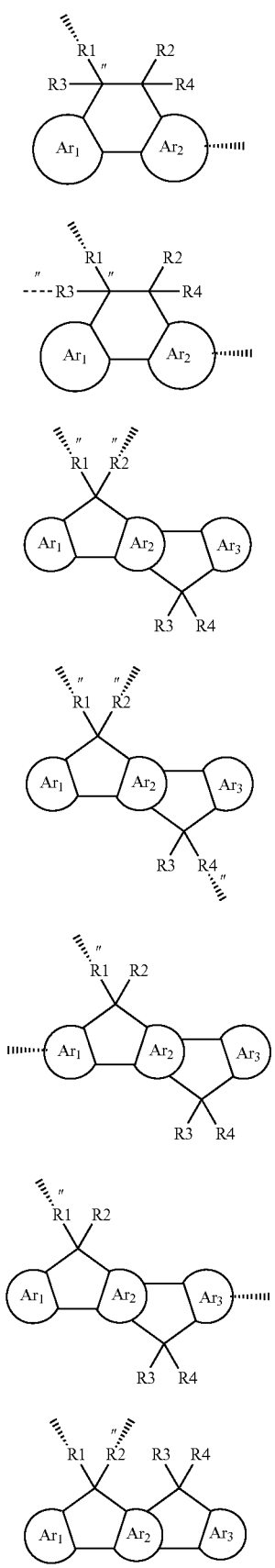

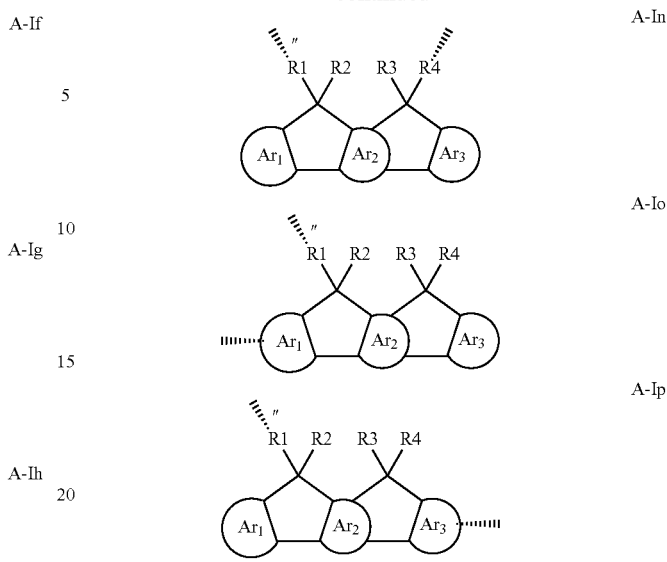

where $Ar_1$, $Ar_2$ and $Ar_3$ each, independently of one another, denote an aromatic or heteroaromatic group having 5 to 60 ring atoms, two of the radicals R1 to R4 or one of the radicals R1 to R4 and one of the groups $Ar_1$, $Ar_2$ and $Ar_3$ form a bond to FG in the general formula I or $FG^1$ in the general formula Ia and a further structural unit, which may be identical to or different from the structural unit of the formula I, and/or R1, R2, R3 and R4 each, independently of one another, denote alkylene, cycloalkylene, alkylsilylene, silylene, arylsilylene, alkylalkoxyalkylene, arylalkoxyalkylene, alkylthioalkylene, phosphine, phosphine oxide, sulfone, alkylenesulfone, sulfone oxide, alkylene sulfone oxide, where the alkylene group in each case has, independently of one another, 1 to 12 C atoms and where one or more H atoms may be replaced by F, Cl, Br, I, alkyl, heteroalkyl, cycloalkyl, an aryl or heteroaryl group, FG is on each occurrence, independently of one another, an opto-electronic functional group, and n is greater than 1.

2. Composition according to claim 1, characterised in that the polymer comprises at least one further structural unit of the formula Ia,

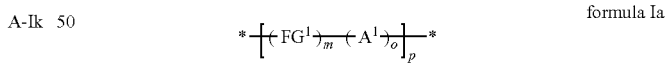

formula Ia where the following applies to the symbols and indices used:

$A^1$ is on each occurrence, independently of one another, a conjugation-interrupting unit, $FG^1$ is on each occurrence, independently of one another, an opto-electronic functional group, m, o are each, independently of one another, 0, 1 or 2, where the sum (m+o) is greater than or equal to 1, and p is greater than or equal to 1.

3. Composition according to claim 2, characterised in that the polymer comprises further structural units which are different from the formula I and/or Ia.

4. Composition according to claim 2, characterised in that the emitter compound is a triplet emitter or a metal complex, and the functional group FG and/or $FG^1$ in the formula I or Ia is selected from a monocyclic or bicyclic condensed aromatic or heteroaromatic group, and where m in the formula Ia is 0 or 1.

5. Composition according to claim 2, wherein
FG and FG$^1$ are each selected, independently of one another, from phenyl, naphthyl, pyridine, anthracene, binaphthylanthracene, phenanthrene, dihydrophenanthrene, indenofluorene, fluorene, spirobifluorene, pyrene, phosphine, phosphine oxide, furan, imidazole, thiophene, triazine, pyrazine, ketone, amine, carbazole and combinations thereof and derivatives and heteroatom variants thereof;
A$^1$ are each, independently of one another, denote a linear or branched alkylene or alkoxyalkylene having 1 to 12 C atoms, where one or more H atoms may be replaced by F;
m in the formula Ia is 0 or 1;
the triplet emitter compound is a metal complex containing a metal selected from the group consisting of the transition metals, the rare earths, the lanthanoids and the actinoids and the composition comprises one or more solvents.

6. Composition according to claim 2, characterised in that FG and FG$^1$ each, independently of one another, denote a substituted or unsubstituted, aromatic or heteroaromatic ring system or an aromatic or heteroaromatic group.

7. Composition according to claim 2, characterised in that FG and FG$^1$ are each, independently of one another, a hole-injection group, a hole transport group, a hole-blocking group, an electron-injection group, an electron-transport group, an electron-blocking group, a photon-absorption group, an exciton-generating group, a singlet exciton sensitiser, an emitter group or a backbone group.

8. Composition according to claim 2, characterised in that FG and FG$^1$ are each selected, independently of one another, from phenyl, naphthyl, pyridine, anthracene, binaphthylanthracene, phenanthrene, dihydrophenanthrene, indenofluorene, fluorene, spirobifluorene, pyrene, phosphine, phosphine oxide, furan, imidazole, thiophene, triazine pyrazine, ketone, amine, carbazole and combinations thereof and derivatives and heteroatom variants thereof.

9. Composition according to claim 2, characterised in that A$^1$ are each selected, independently of one another, from the group consisting of linear or branched alkylene, cycloalkylene, alkylsilylene, silylene, arylsilylene, alkylalkoxyalkylene, arylalkoxyalkylene, alkylthioalkylene, sulfone, alkylenesulfone, sulfone oxide, alkylenesulfone oxide, where the alkylene group in each case has, independently of one another, 1 to 12 C atoms and where one or more H atoms may be replaced by F, Cl, Br, I, alkyl, heteroalkyl, cycloalkyl, aryl or heteroaryl.

10. Composition according to claim 9, characterised in that A$^1$ each, independently of one another, denote a linear or branched alkylene or alkoxyalkylene having 1 to 12 C atoms, where one or more H atoms may be replaced by F.

11. Composition according to claim 1, characterised in that the emitter compound is a green-, blue- or red-emitting triplet emitter.

12. Composition according to claim 1, characterised in that the emitter compound is a metal complex containing a metal selected from the group consisting of the transition metals, the rare earths, the lanthanoids and the actinoids.

13. Composition according to claim 1, characterised in that the polymer to emitter compound weight ratio in the composition is 99.1:0.01 to 98:2.

14. Composition according to claim 1, characterised in that it comprises one or more solvents.

15. Polymer, characterised in that it comprises at least one structural unit of the general formula I used as matrix material a the triplet emitter compound

formula I where the following applies to the symbols and indices used:
A is on each occurrence, independently of one another, a conjugation-interrupting unit selected from the group consisting of A-1d to A1p,

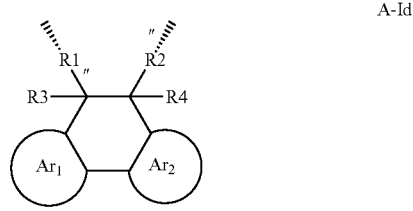

A-Id

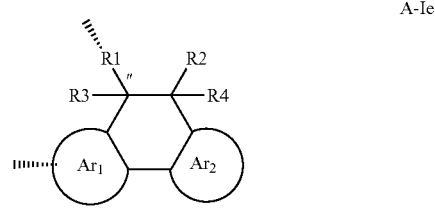

A-Ie

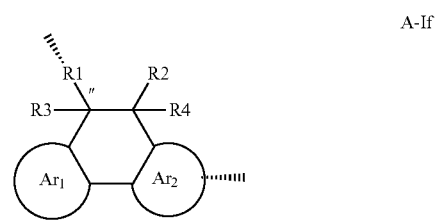

A-If

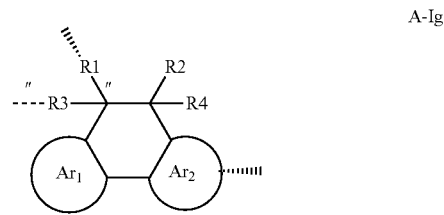

A-Ig

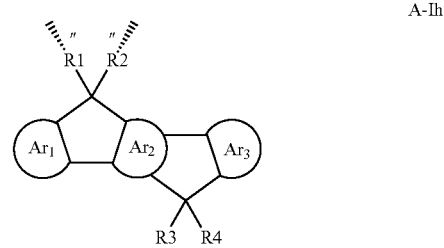

A-Ih

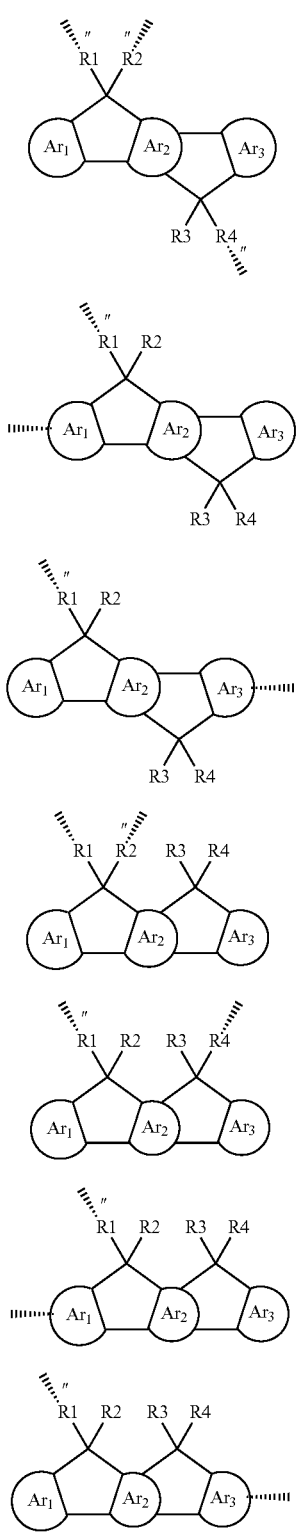

where Ar$_1$, Ar$_2$ and Ar$_3$ each, independently of one another, denote an aromatic or heteroaromatic group having 5 to 60 ring atoms, two of the radicals R1 to R4 or one of the radicals R1 to R4 and one of the groups Ar$_1$, Ar$_2$ and Ar$_3$ form a bond to FG in the general formula I or FG$^1$ in the general formula Ia and a further structural unit, which may be identical to or different from the structural unit of the formula I, and/or R1, R2, R3 and R4 each, independently of one another, denote alkylene, cycloalkylene, alkylsilylene, silylene, arylsilylene, alkylalkoxyalkylene, arylalkoxyalkylene, alkylthioalkylene, phosphine, phosphine oxide, sulfone, alkylenesulfone, sulfone oxide, alkylene sulfone oxide, where the alkylene group in each case has, independently of one another, 1 to 12 C atoms and where one or more H atoms may be replaced by F, Cl, Br, I, alkyl, heteroalkyl, cycloalkyl, an aryl or heteroaryl group, FG is on each occurrence, independently of one another, an opto-electronic functional group, and n is greater than 1.

16. Polymer according to claim 15, characterised in that it comprises at least one further structural unit of the formula Ia,

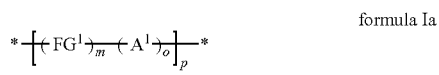

formula Ia where the following applies to the symbols and indices used:

A$^1$ is on each occurrence, independently of one another, a conjugation-interrupting unit, FG$^1$ is on each occurrence, independently of one another, an opto-electronic functional group, m, o are each, independently of one another, 0, 1 or 2, where the sum (m+o) is greater than or equal to 1, and p is greater than or equal to 1.

17. Polymer according to claim 16, characterised in that FG and FG$^1$ each, independently of one another, denote a substituted or unsubstituted, aromatic or heteroaromatic ring system or an aromatic or heteroaromatic group.

18. Polymer according to claim 16, characterised in that FG and FG$^1$ are each, independently of one another, a hole-injection group, a hole-transport group, a hole-blocking group, an electron-injection group, an electron-transport group, an electron-blocking group, a photon-absorption group, an exciton-generating group, a singlet exciter sensitiser, an emitter group or a backbone group.

19. Polymer according to claim 16, characterised in that FG and FG$^1$ are each selected, independently of one another, from phenyl, naphthyl, pyridine, anthracene, binaphthylanthracene, phenanthrene, dihydrophenanthrene, indenofluorene, fluorene, spirobifluorene, pyrene, phosphine, phosphine oxide, furan, imidazole, thiophene, triazine, pyrazine, ketone, amine, carbazole and combinations thereof and derivatives and heteroatom variants thereof.

20. Polymer according to claim 16, characterised in that A$^1$ are each selected, independently of one another, from the group consisting of linear or branched alkylene, cycloalkylene, alkylsilylene, silylene, arylsilylene, alkylalkoxyalkylene, arylalkoxyalkylene, alkylthioalkylene, sulfone, alkylenesulfone, sulfone oxide, alkylenesulfone oxide, where the alkylene group in each case has, independently of one another, 1 to 12 C atoms and where one or more H atoms may be replaced by F, Cl, Br, I, alkyl, heteroalkyl, cycloalkyl, aryl or heteroaryl.

21. An opto-electronic device which comprises the composition according to claim 1 or the polymer according to claim 15.

22. The device according to claim 21, characterised in that the composition or polymer is in the form of a layer in the opto-electronic device.

23. Opto-electronic device, characterised in that it comprises a cathode, an anode and at least one composition according to claim 1 or a polymer according to claim 15.

24. Opto-electronic device according to claim 23, characterised in that the composition or polymer is in the form of a layer and is arranged between the cathode and the anode.

25. Opto-electronic device according to claim 23, characterised in that it comprises further layers selected from a hole-transport, hole-injection, emitter, electron-transport, electron-injection, charge-blocking, charge-generation layer and/or an interlayer.

26. Opto-electronic device according to claim 23, characterised in that the opto-electronic device is an organic electroluminescent device (OLED), a polymeric electroluminescent device (PLED), an organic integrated circuit (O-IC), an organic field-effect transistor (O-FET), an organic thin-film transistor (O-TFT), an organic light-emitting transistor (O-LET), an organic solar cell (O-SC), an organic optical detector, an organic photoreceptor, an organic field-quench device (O-FQD), a light-emitting electrochemical cell (LEC) or an organic laser diode (O-laser).

* * * * *